US012700435B2

(12) United States Patent
Chen et al.

(10) Patent No.: US 12,700,435 B2
(45) Date of Patent: Aug. 4, 2026

(54) CIRCUIT AND METHOD FOR POWER MANAGEMENT

(71) Applicants: TAIWAN SEMICONDUCTOR MANUFACTURING COMPANY, LTD, Hsinchu (TW); TSMC NANJING COMPANY, LIMITED, Nanjing (CN)

(72) Inventors: Chia-Cheng Chen, Hsinchu (TW); Jun Xie, Hisnchu (TW); Chenhui Huang, Hsinchu (TW); Luping Kong, Hsinchu (TW); Ching-Wei Wu, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 233 days.

(21) Appl. No.: 18/426,899

(22) Filed: Jan. 30, 2024

(65) Prior Publication Data

US 2025/0226012 A1     Jul. 10, 2025

(30) Foreign Application Priority Data

Jan. 5, 2024    (CN) .......................... 202410022012.8

(51) Int. Cl.
*G11C 5/14* (2006.01)
*H03K 19/0185* (2006.01)
(52) U.S. Cl.
CPC ..... *G11C 5/147* (2013.01); *H03K 19/018521* (2013.01)

(58) Field of Classification Search
CPC ...................................................... G11C 5/14
See application file for complete search history.

(56) References Cited

U.S. PATENT DOCUMENTS

| | | | |
|---|---|---|---|
| 2006/0119393 A1 | 6/2006 | Hua et al. | |
| 2022/0199124 A1* | 6/2022 | Yang ...................... | G11C 5/147 |
| 2023/0131586 A1* | 4/2023 | Pedersen ............... | G06F 1/3275 |
| | | | 713/320 |

(Continued)

FOREIGN PATENT DOCUMENTS

| | | |
|---|---|---|
| KR | 10-2022-0027744 | 3/2022 |
| KR | 10-2023-0137213 | 10/2023 |
| TW | 202230988 | 8/2022 |

*Primary Examiner* — Douglas King
(74) *Attorney, Agent, or Firm* — Hauptman Ham, LLP

(57)     ABSTRACT

A circuit includes a memory circuit, and a power management circuit having a first circuit. The first circuit is configured to, in response to a first state of the first power management control signal and a first state of the second power management control signal, control supply of a first supply voltage to the memory circuit in accordance with a first power mode control signal. The first circuit is further configured to, in response to a second state of the first power management control signal, store a state of the first power mode control signal, and control supply of the first supply voltage to the memory circuit in accordance with the stored state of the first power mode control signal. The power management circuit is configured to, in response to a second state of the second power management control signal, disable a part of the first circuit.

20 Claims, 10 Drawing Sheets

(56) References Cited

U.S. PATENT DOCUMENTS

2023/0139283 A1\* 5/2023 Raj ................. G11C 29/50016
714/721
2023/0139579 A1 5/2023 Shin et al.
2023/0298662 A1 9/2023 Jain \* cited by examiner

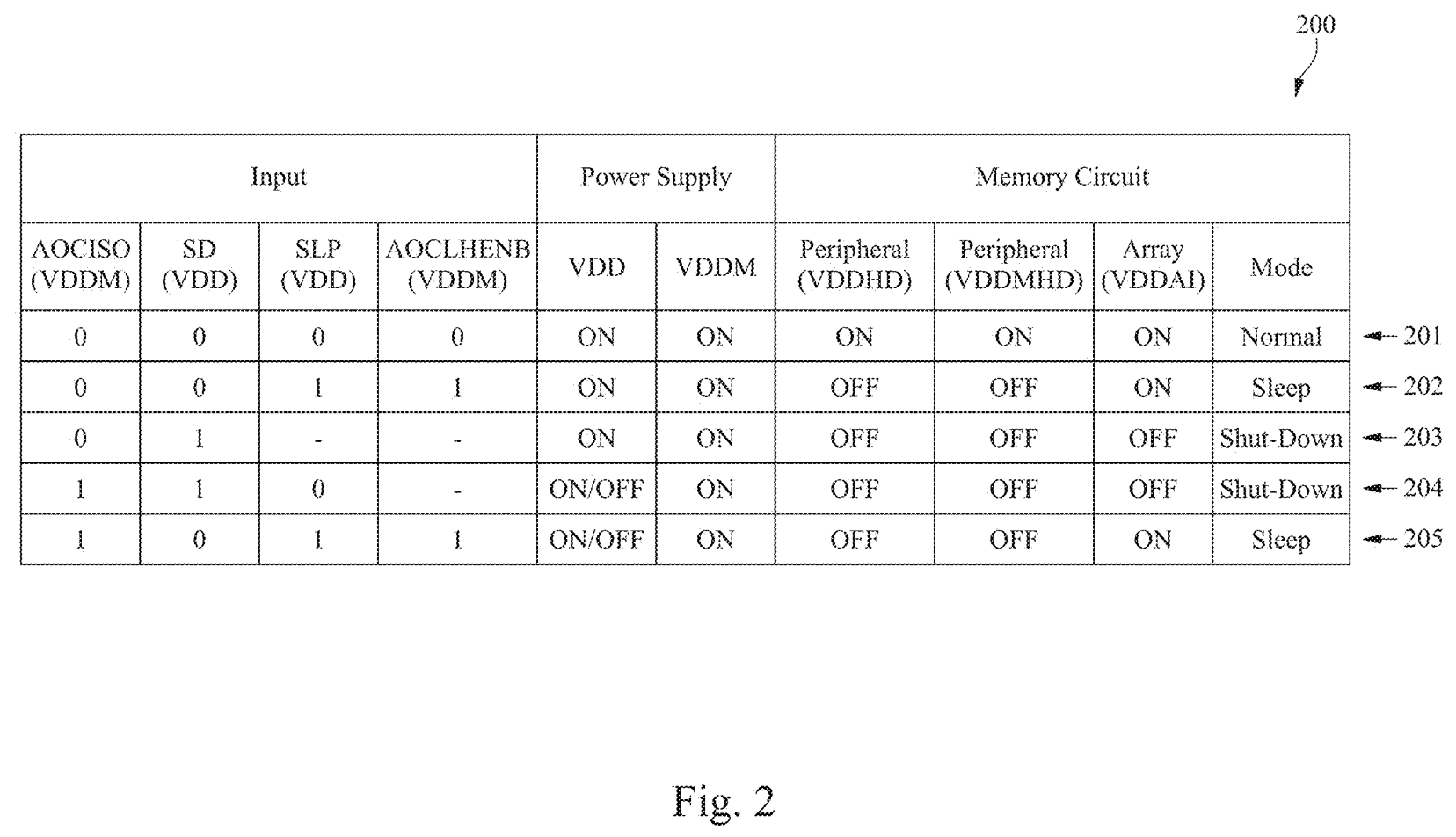

200

| Input | | | | Power Supply | | Memory Circuit | | | |
|---|---|---|---|---|---|---|---|---|---|
| AOCISO (VDDM) | SD (VDD) | SLP (VDD) | AOCLHENB (VDDM) | VDD | VDDM | Peripheral (VDDHD) | Peripheral (VDDMHD) | Array (VDDAI) | Mode |
| 0 | 0 | 0 | 0 | ON | ON | ON | ON | ON | Normal | ← 201 |
| 0 | 0 | 1 | 1 | ON | ON | OFF | OFF | ON | Sleep | ← 202 |
| 0 | 1 | - | - | ON | ON | OFF | OFF | OFF | Shut-Down | ← 203 |
| 1 | 1 | 0 | - | ON/OFF | ON | OFF | OFF | OFF | Shut-Down | ← 204 |
| 1 | 0 | 1 | 1 | ON/OFF | ON | OFF | OFF | ON | Sleep | ← 205 |

Fig. 2

CIRCUIT AND METHOD FOR POWER MANAGEMENT

BACKGROUND

Integrated circuits (ICs) are widely used in various digital devices and/or applications in different areas. As ICs have become more complex, various power modes or schemes are considered to reduce power consumption, while ensuring proper functionality of the ICs as designed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a table including various power modes of a circuit, in accordance with some embodiments.

DETAILED DESCRIPTION

Figure 1:
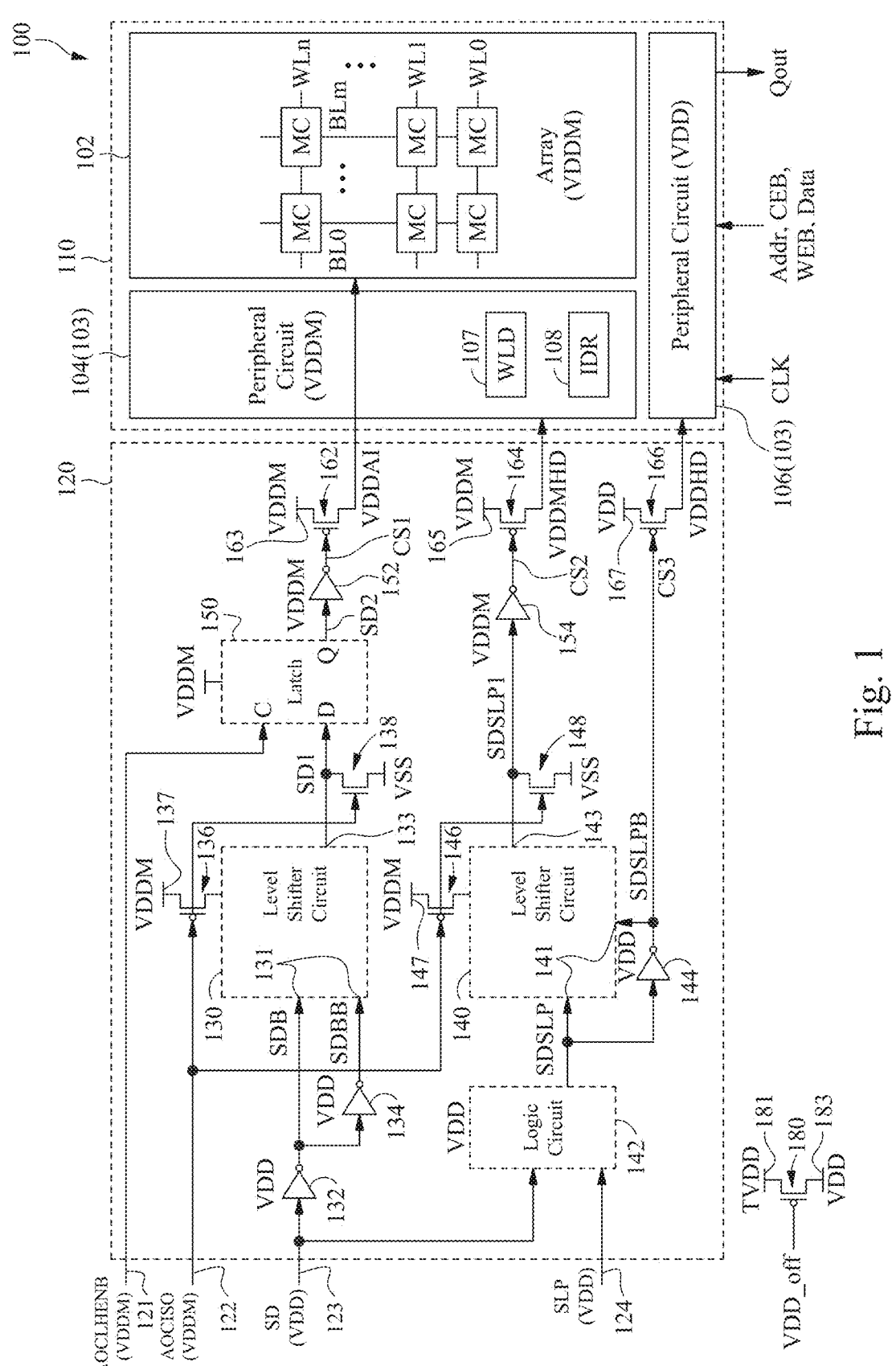
FIG. 1 is a schematic block diagram of a circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC comprises several power domains of different power supply voltages for different circuits and/or different purposes. For example, a memory circuit in one or more embodiments comprises a memory array and peripheral circuitry. The memory array is in, or powered by, a first power domain of a first power supply voltage, e.g., VDDM. The peripheral circuitry is at least partially in, or powered by, a second power domain of a second power supply voltage, e.g., VDD, different from VDDM. The first power domain of VDDM is sometimes referred to as the VDDM power domain, and the second power domain of VDD is sometimes referred to as the VDD power domain. In at least one embodiment, the memory circuit comprises independent VDDM and VDD power supplies, or power sources, each configured to provide the corresponding VDDM or VDD independently from the other. This configuration is sometimes referred to as an array dual rail (ADR) configuration.

In some embodiments, VDD is to be turned OFF, in a state sometimes referred to as VDD buck-off, to reduce power consumption. When a power mode control signal is in the VDD power domain and potentially becomes unavailable when VDD is turned OFF, a state of the power mode control signal is stored, in response to a first power management control signal, in the VDDM power domain and a power mode of the memory circuit during VDD buck-off is controlled based on the stored state of the power mode control signal. In at least one embodiment, in response to a second power management control signal, interface circuits between the VDD power domain and the VDDM power domain are disabled. A reason, in accordance with some embodiments, is to isolate the VDDM power domain, which remains ON, from the VDD power domain, which is to be turned OFF. In one or more embodiments, power consumption is reduced in a more flexible arrangement than other approaches.

FIG. 1 is a schematic block diagram of a circuit 100, in accordance with some embodiments. In the example configuration in FIG. 1, the circuit 100 is a memory device. In at least one embodiment, a memory device is an individual IC device. In some embodiments, a memory device is included as a part of a larger IC device which comprises circuitry other than the memory device for other functionalities. Circuit configurations other than memory devices are within the scopes of various embodiments.

The circuit 100 comprises a memory circuit 110, and a power management circuit 120. The power management circuit 120 is configured to control supply of various supply voltages to the memory circuit 110 in a plurality of power modes. The memory circuit 110 is an example of external circuitry configured to operate at and receive the supply voltages provided by the power management circuit 120. External circuitry other than memory circuits is within the scopes of various embodiments. Examples of such external circuitry include, but are not limited to, radio frequency or cellular transceiver circuitry, global positioning system (GPS) receiver circuitry, network interface circuitry, central processing units (CPUs), multi-core CPUs, neural processing units (NPUs), graphics processing units (GPUs), digital signal processors (DSPs), multimedia processors, voice processing units, or the like. Various embodiments where the external circuitry is a memory circuit are described in detail herein. In some embodiments, the power management circuit 120 is configured to control supply of various supply voltages to external circuitry other than a memory circuit in manners similar to those described in detail herein.

The memory circuit 110 comprises a memory array 102, and peripheral circuitry 103. In some embodiments, except for the memory array 102 and any other memory arrays included in the memory circuit 110, remaining circuits and components of the memory circuit 110 are collectively referred to as a memory controller, or the peripheral circuitry 103.

The memory array 102 comprises a plurality of memory cells MC, a plurality of word lines WL0 to WLn, and a plurality of bit lines BL0 to BLm, where n and m are natural numbers. In the memory array 102, the memory cells MC are arranged in a plurality of columns corresponding to the bit lines, and a plurality of rows corresponding to the word lines. Columns and rows in a memory array are sometimes referred to as memory columns and memory rows. Each memory cell MC is electrically coupled to a corresponding word line and a corresponding bit line. In some embodiments, each memory cell MC is electrically coupled to more than one word line and/or more than one bit line. The word lines are configured for transmitting addresses of memory cells MC to be accessed in a read operation or a write operation. The word lines are sometimes referred to as "address lines." The bit lines are configured for transmitting data read from, or data to be written into, the memory cells MC indicated by the addresses on the corresponding word lines. The bit lines are sometimes referred to as "data lines." Various numbers of word lines and/or bit lines in the memory array 102 are within the scope of various embodiments. In some embodiments, the memory cells MC comprise static random access memory (SRAM) cells. In some embodiments, the memory cells MC comprise dynamic random access memory (DRAM) cells, other volatile RAM memory cells, or the like. In some embodiments, the memory cells MC comprise resistive random access memory (RRAM) cells, a ferroelectric RAM (F-RAM) cells, Magnetoresistive RAM (MRAM) cells, Phase-change memory (PCM) cells, other non-volatile RAM memory cells, or the like.

In some embodiments, the peripheral circuitry 103 comprises one or more circuits including, but not limited to, row decoders, column decoders, pre-charging circuits, selection circuits, sense amplifiers, word line driving circuits, bit line driving circuits, address latches, pulse generators, timing circuits, control circuits, clock generators and/or drivers, input/output (I/O) circuits for data, address, clock and/or control exchange with external devices, or the like. For example, row decoders are configured to decode a row address of one or more memory cells MC selected to be accessed, and word line driving circuits are configured to supply a set of access voltages to the selected word line(s) corresponding to the decoded row address. Column decoders are configured to decode a column address of one or more memory cells MC selected to be accessed, and selection circuits are configured to electrically couple one or more of bit line driving circuits, and/or sense amplifiers, to the selected bit line(s) corresponding to the decoded column address. The bit line driving circuits, or the sense amplifiers, are configured to supply voltages to, or to detect voltages on, the selected bit lines in read operations or write operations. The described memory circuit configuration is an example, and other memory circuit configurations are within the scopes of various embodiments.

The memory circuit 110 comprises an ADR configuration having a first power domain of a first power supply voltage, and a second power domain of a second power supply voltage different from the first power supply voltage. For example, as described herein, the first power supply voltage is VDDM, the first power domain is the VDDM power domain, the second power supply voltage is VDD, and the second power domain is the VDD power domain. VDDM and VDD are positive power supply voltages which are different from each other. For example, VDDM has a first voltage swing between a low level and a high level thereof. VDD has a second voltage swing between a low level and a high level thereof, and the second voltage swing is different from the first voltage swing. A signal in the VDDM power domain has a voltage swing corresponding to the first voltage swing. A signal in the VDD power domain has a voltage swing corresponding to the second voltage swing, and is different from the voltage swing of a signal in the VDDM power domain. In at least one embodiment, VDDM is higher than VDD. In some embodiments, VDDM is lower than VDD. Whether VDDM is higher, or lower, than VDD is a design consideration depending on various factors including, but not limited to, applications, power requirements, speed requirements, or the like.

The memory array 102 are in, or powered by, the VDDM power domain. The peripheral circuitry 103 comprises a peripheral circuit 104 in or powered by the VDDM power domain, and a peripheral circuit 106 in or powered by the VDD power domain.

In some embodiments, being in or powered by the VDDM power domain means that the memory cells MC and various circuits and/or components of the peripheral circuit 104 are electrically coupled to a VDDM power supply, and/or one or more VDDM power rails, and/or one or more nodes having the voltage VDDM. In other words, the operating voltage of the memory cells MC and the peripheral circuit 104 is VDDM. Signals transmitted among memory cells MC and various circuits and/or components of the peripheral circuit 104 are also in the VDDM power domain.

In some embodiments, being in or powered by the VDD power domain means that various circuits and/or components of the peripheral circuit 106 are electrically coupled to a VDD power supply, and/or one or more VDD power rails, and/or one or more nodes having the voltage VDD. In other words, the operating voltage of various circuits and/or components of the peripheral circuit 106 is VDD. In at least one embodiment, pre-charging circuits, sense amplifiers, and I/O circuits are in the VDD power domain. Signals transmitted among various circuits and/or components of the peripheral circuit 106 are also in the VDD power domain. In the configuration in FIG. 1, examples of I/O signals transmitted and/or received by the I/O circuits comprise clock signals (CLK), addresses (Addr) of memory cells to be accessed, input data (Data) to be written to accessed memory cells, output data (Qout) read from accessed memory cells, a chip enable (CEB) signal, and a write enable (WEB) signal. The CEB signal is a signal to enable or disable the memory circuit 110. The signal WEB is a signal to enable or disable writing to one or more memory cells MC. The I/O signals are in the VDD power domain. Other I/O signals are within the scopes of various embodiments.

In some embodiments, some circuits and/or components of the peripheral circuitry 103 are configured to interface between the VDDM power domain and the VDD power domain. Such circuits and/or components are sometimes referred to as interface circuits. An interface circuit is configured to receive a signal in one of the VDDM power domain and VDD power domain, and to output a corresponding signal in the other of the VDDM power domain and VDD power domain. An example interface circuit is a word line driving circuit (WLD) 107. The WLD 107 is configured to, in response to a control signal in the VDD power domain, output an access voltage of the VDDM power domain to one or more word lines corresponding to a decoded row address for accessing one or more selected memory cells MC. Another example interface circuit is a level shifter circuit, such as an input level-shifter (IDR) 108, or various level shifter circuits in one or more power management circuits described herein. A level shifter circuit is configured to receive a signal in one of the VDDM power domain and VDD power domain, and to generate a level-shifted signal corresponding to the received signal in the other of the VDDM power domain and VDD power domain. The illustration of the WLD 107 and IDR 108 in the peripheral circuit 104 is an example. In some embodiments, one or more interface circuits are configured at an interface between the memory array 102 and the peripheral circuit 106, and/or at an interface between the peripheral circuit 104 and the peripheral circuit 106.

The power management circuit 120 is configured to control supply of various supply voltages to the memory array 102. For example, the power management circuit 120 is configured to control supply of a first supply voltage VDDAI corresponding to VDDM to the memory array 102, a second supply voltage VDDMHD corresponding to VDDM to the peripheral circuit 104, and a third supply voltage VDDHD corresponding to VDD to the peripheral circuit 106. In some embodiments, controlling supply of a supply voltage means that the power management circuit 120 is configured to controllably provide (output) the supply voltage to the memory circuit 110, or to stop providing (stop outputting) the supply voltage to the memory circuit 110, in response to one or more control signals at one or more corresponding inputs of the power management circuit 120.

Specifically, the power management circuit 120 comprises first through fourth inputs 121-124 configured to correspondingly receive control signals AOCLHENB, AOCISO, SD, and SLP. The signal AOCLHENB and signal AOCISO are in the VDDM power domain. The signal SD and signal SLP are in the VDD power domain. In at least one embodiment, the signal AOCLHENB is referred to as a first power management control signal, the signal AOCISO is referred to as a second power management control signal, the signal SD is referred to as a first power mode control signal, and the signal SLP is referred to as a second power mode control signal. In some embodiments, one or more of the signal AOCLHENB, signal AOCISO, signal SD, signal SLP is/are generated by an external circuit outside the circuit 100. In some embodiments, one or more of the signal AOCLHENB, signal AOCISO, signal SD, signal SLP is/are generated by a control circuit included in the circuit 100.

The power management circuit 120 further comprises a first level shifter circuit 130, a second level shifter circuit 140, a latch circuit 150, inverters 132, 134, 144, 152, 154, header circuits 136, 146, 162, 164, 166, switches 138, 148, and a logic circuit 142. The header circuits 162, 164, 166 are sometimes referred to as output header circuits. In the example configuration in FIG. 1, each of the header circuits 136, 146, 162, 164, 166 comprises a P-type transistor, e.g., a P-channel metal-oxide semiconductor (PMOS) transistor, and each of the switches 138, 148 comprises an N-type transistor, e.g., an N-channel metal-oxide semiconductor (NMOS) transistor. Other configurations for header circuits and/or switches are within the scopes of various embodiments. Other transistor configurations are within the scopes of various embodiments. Example transistor configurations include, but are not limited to, metal oxide semiconductor field effect transistors (MOSFET), complementary metal oxide semiconductors (CMOS) transistors, bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In some embodiments, a P-type transistor is replaceable by one or more N-type transistors, and vice versa. For simplicity, the header circuits 136, 146, 162, 164, 166 are sometimes referred to herein as PMOS transistors 136, 146, 162, 164, 166, and the switch 138, 148 are sometimes referred to herein as NMOS transistors 138, 148.

The inverters 132, 134, 144, the logic circuit 142, and the header circuit 166 are in the VDD power domain, as indicated by the label "VDD" in the drawings. The latch circuit 150, inverters 152, 154, and header circuits 136, 146, 162, 164 are in the VDDM power domain, as indicated by the label "VDDM" in the drawings. The switches 138, 148 are also in the VDDM power domain. The level shifter circuits 130, 140 are interface circuits between the VDD power domain and the VDDM power domain.

The level shifter circuit 130 has an input 131 coupled to the input 123, and an output 133. In the example configuration in FIG. 1, the input 131 of the level shifter circuit 130 is coupled to the input 123 of the power management circuit 120 through the inverters 132, 134.

The inverter 132 has an input coupled to the input 123 to receive the signal SD, and an output at which the inverter 132 is configured to output an inverted signal SDB of the signal SD. The inverter 134 has an input coupled to the output of the inverter 132 to receive the signal SDB, and an output at which the inverter 134 is configured to output an inverted signal SDBB of the signal SDB. In at least one embodiment, except for a time delay, the signal SDBB is the same as the signal SD. The signal SDB and signal SDBB are in the VDD power domain. The outputs of the inverters 132, 134 are coupled to the input 131 of the level shifter circuit 130.

The described inverters 132, 134 are an example of a first connection circuit coupled between the input 123 of the power management circuit 120 and the input 131 of the level shifter circuit 130. Other configurations of the first connection circuit are within the scopes of various embodiments. For example, in at least one embodiment, the first connection circuit is a conductor. In some embodiments, one or more of the inverters 132, 134 is/are omitted or is/are included in the level shifter circuit 130.

The level shifter circuit 130 is configured to receive VDDM through the header circuit 136. Specifically, the header circuit or PMOS transistor 136 is coupled between a first node 137 of VDDM and the level shifter circuit 130, and has a control input coupled to the input 122. For example, a first source/drain of the PMOS transistor 136 is coupled to the node 137, a second source/drain of the PMOS transistor 136 is coupled to the level shifter circuit 130, and a gate of the PMOS transistor 136 is coupled to the input 122 to receive the signal AOCISO.

The switch or NMOS transistor 138 is coupled between a reference node of a reference voltage (e.g., the ground voltage VSS) and the output 133 of the level shifter circuit 130, and has a control input coupled to the input 122. For example, a first source/drain of the NMOS transistor 138 is coupled to the output 133 of the level shifter circuit 130, a second source/drain of the NMOS transistor 138 is coupled to VSS, and a gate of the NMOS transistor 138 is coupled to the input 122 to receive the signal AOCISO.

In response to a first state (e.g., a low level) of the signal AOCISO, the PMOS transistor 136 is turned ON and the NMOS transistor 138 is turned OFF. The turned ON PMOS transistor 136 connects VDDM to the level shifter circuit 130 to power or enable the level shifter circuit 130. The level shifter circuit 130, when enabled or powered, is configured to generate a first level-shifted signal SD1 which is a level-shifted version of the signal SDB. The signal SD1 is in the VDDM power domain, and corresponds to the signal SD.

In response to a second state (e.g., a high level) of the signal AOCISO, the PMOS transistor 136 is turned OFF and the NMOS transistor 138 is turned ON. The turned OFF PMOS transistor 136 disconnects VDDM from the level shifter circuit 130, thereby disabling the level shifter circuit 130. The turned ON NMOS transistor 138 connects the output 133 of the disabled level shifter circuit 130 to VSS, and sets the signal SD1 to a predetermined voltage, i.e., VSS.

The level shifter circuit 140 has an input 141 coupled to the input 123, and an output 143. In the example configuration in FIG. 1, the input 141 of the level shifter circuit 140 is coupled to the inputs 123, 124 of the power management circuit 120 through the logic circuit 142 and inverter 144.

The logic circuit 142 has inputs correspondingly coupled to the inputs 123, 124 of the power management circuit 120 to receive the signal SD and signal SLP, and an output at which the logic circuit 142 is configured to output a combined power mode control signal SDSLP. In at least one embodiment, the logic circuit 142 is configured to generate the signal SDSLP by performing a logic operation on the signal SD and signal SLP. In an example configuration described herein, the logic circuit 142 is configured to perform a NOR operation on the signal SD and signal SLP to generate the signal SDSLP. Other logic operations, such as OR, AND, NAND, XOR, or the like are within the scopes of various embodiments. The inverter 144 has an input coupled to the output of the logic circuit 142 to receive the signal SDSLP, and an output at which the inverter 144 is configured to output an inverted signal SDSLPB of the signal SDSLP. The signal SDSLP and signal SDSLPB are in the VDD power domain. The outputs of the logic circuit 142 and inverter 144 are coupled to the input 141 of the level shifter circuit 140.

The described logic circuit 142 and inverter 144 are an example of a second connection circuit coupled between the inputs 123, 124 of the power management circuit 120 and the input 141 of the level shifter circuit 140. Other configurations of the second connection circuit are within the scopes of various embodiments. In some embodiments, the inverter 144 is omitted or is included in the level shifter circuit 140.

The level shifter circuit 140 is configured to receive VDDM through the header circuit 146. Specifically, the header circuit or PMOS transistor 146 is coupled between a second node 147 of VDDM and the level shifter circuit 140, and has a control input coupled to the input 122. For example, a first source/drain of the PMOS transistor 146 is coupled to the node 147, a second source/drain of the PMOS transistor 146 is coupled to the level shifter circuit 140, and a gate of the PMOS transistor 146 is coupled to the input 122 to receive the signal AOCISO.

The switch or NMOS transistor 148 is coupled between a reference node of a reference voltage (e.g., the ground voltage VSS) and the output 143 of the level shifter circuit 140, and has a control input coupled to the input 122. For example, a first source/drain of the NMOS transistor 148 is coupled to the output 143 of the level shifter circuit 140, a second source/drain of the NMOS transistor 148 is coupled to VSS, and a gate of the NMOS transistor 148 is coupled to the input 122 to receive the signal AOCISO.

In response to the first state (e.g., the low level) of the signal AOCISO, the PMOS transistor 146 is turned ON and the NMOS transistor 148 is turned OFF. The turned ON PMOS transistor 146 connects VDDM to the level shifter circuit 140 to power or enable the level shifter circuit 140. The level shifter circuit 140, when enabled or powered, is configured to generate a second level-shifted signal SDSLP1 which is a level-shifted version of the signal SDSLP. The signal SDSLP1 is in the VDDM power domain, and corresponds to the signal SD and signal SLP.

In response to the second state (e.g., the high level) of the signal AOCISO, the PMOS transistor 146 is turned OFF and the NMOS transistor 148 is turned ON. The turned OFF PMOS transistor 146 disconnects VDDM from the level shifter circuit 140, thereby disabling the level shifter circuit 140. The turned ON NMOS transistor 148 connects the output 143 of the disabled level shifter circuit 140 to VSS, and sets the signal SDSLP1 to a predetermined voltage, i.e., VSS.

The latch circuit 150 has a control input C coupled to the input 121 of the power management circuit 120 to receive the signal AOCLHENB, a data input D coupled to the output 133 of the level shifter circuit 130 to receive the signal SD1, and an output Q. The control input C is sometimes referred to as a clock input of the latch circuit 150. The latch circuit 150 is configured to generate a latch output signal SD2 at the output Q, based on the signal SD1 at the data input D and the signal AOCLHENB at the control input C.

Specifically, in response to a first state (e.g., a low level) of the signal AOCLHENB at the control input C, the latch circuit 150 is configured to be in a "transparent", or pass-through, state, and pass the signal SD1 at the data input D to the output Q. For example, in the "transparent" state, the signal SD2 at the output Q of the latch circuit 150 corresponds to the signal SD1 at the data input D.

In response to a second state (e.g., a high level) of the signal AOCLHENB at the control input C, the latch circuit 150 is configured to be in a latched state, and is configured to latch or store a state of the signal SD1 when the signal AOCLHENB switches from the first state to the second state. Because the signal SD1 corresponds to the signal SD, the latch circuit 150 is configured to latch or store a state of the signal SD. In the latched state, the latch circuit 150 is configured to output the signal SD2 based on the latched or stored state of the signal SD, until the signal AOCLHENB switches back from the second state to the first state.

The inverter 152 has an input coupled to the output Q of the latch circuit 150 to receive the signal SD2, and an output at which the inverter 152 is configured to output an inverted signal CS1 of the signal SD2. In some embodiments, the inverter 152 is omitted.

The header circuit or PMOS transistor 162 has a gate coupled to the output of the inverter 152 to receive the signal CS1. A first source/drain of the PMOS transistor 162 is coupled to a node 163 of VDDM. A second source/drain of the PMOS transistor 162 is coupled to the memory array 102 to controllably supply VDDM, as the supply voltage VDDAI, to the memory array 102 in response to the signal CS1. For example, in response to a low level of the signal CS1, the PMOS transistor 162 is turned ON and outputs the supply voltage VDDAI to the memory array 102. In response to a high level of the signal CS1, the PMOS transistor 162 is turned OFF and stops outputting the supply voltage VDDAI to the memory array 102.

The inverter 154 has an input coupled to the output 143 of the level shifter circuit 140 to receive the signal SDSLP1, and an output at which the inverter 154 is configured to output an inverted signal CS2 of the signal SDSLP1. In some embodiments, the inverter 154 is omitted.

The header circuit or PMOS transistor 164 has a gate coupled to the output of the inverter 154 to receive the signal CS2. A first source/drain of the PMOS transistor 164 is coupled to a node 165 of VDDM. In at least one embodiment, the node 165 is the same node, or belongs to the same power rail, as the node 163. A second source/drain of the PMOS transistor 164 is coupled to the peripheral circuit 104 to controllably supply VDDM, as the supply voltage VDDMHD, to the peripheral circuit 104 in response to the signal CS2. For example, in response to a low level of the signal CS2, the PMOS transistor 164 is turned ON and outputs the supply voltage VDDMHD to the peripheral circuit 104. In response to a high level of the signal CS2, the PMOS transistor 164 is turned OFF and stops outputting the supply voltage VDDMHD to the peripheral circuit 104.

The header circuit or PMOS transistor 166 has a gate coupled to the output of the inverter 144 to receive the signal CS3 which, in the example configuration in FIG. 1, is the signal SDSLPB. A first source/drain of the PMOS transistor 166 is coupled to a node 167 of VDD. A second source/drain of the PMOS transistor 166 is coupled to the peripheral circuit 106 to controllably supply VDD, as the supply voltage VDDHD, to the peripheral circuit 106 in response to the signal CS3. For example, in response to a low level of the signal CS3 or signal SDSLPB, the PMOS transistor 166 is turned ON and outputs the supply voltage VDDHD to the peripheral circuit 106. In response to a high level of the signal CS3 or signal SDSLPB, the PMOS transistor 166 is turned OFF and stops outputting the supply voltage VDDHD to the peripheral circuit 106.

The level shifter circuit 130 and latch circuit 150 are an example of a first circuit which is configured to control supply of the supply voltage VDDAI to the memory circuit 110 in accordance with the signal AOCLHENB, signal AOCISO and signal SD. As described herein, in response to a first state (e.g., a low level) of the signal AOCLHENB and a first state (e.g., a low level) of the signal AOCISO, the first circuit is configured to control supply of the supply voltage VDDAI to the memory circuit 110 in accordance with the signal SD, which is level-shifted by the enabled level shifter circuit 130, then passed through the latch circuit 150 in the "transparent" state, and supplied as the signal CS1 to turn ON or OFF the PMOS transistor 162. For example, in response to a first state (e.g., a low level) of the signal SD, the signal CS1 has a corresponding low level, and the PMOS transistor 162 is turned ON and outputs the supply voltage VDDAI to the memory circuit 110. In response to a second state (e.g., a high level) of the signal SD, the signal CS1 has a corresponding high level, and the PMOS transistor 162 is turned OFF and stops outputting the supply voltage VDDAI to the memory circuit 110.

In response to a second state (e.g., a high level) of the signal AOCLHENB, the first circuit is configured to store a state of the signal SD in the latch circuit 150 being in the latched state, and control supply of the supply voltage VDDAI in accordance with the stored state of the signal SD, by outputting the signal SD2 based on the stored state of the signal SD to turn ON or OFF the PMOS transistor 162. For example, in response to the stored state of the signal SD being the first state (e.g., the low level), the signal CS1 has the corresponding low level, and the PMOS transistor 162 is turned ON and outputs the supply voltage VDDAI to the memory circuit 110. In response to the stored state of the signal SD being the second state (e.g., the high level), the signal CS1 has a corresponding high level, and the PMOS transistor 162 is turned OFF and stops outputting the supply voltage VDDAI to the memory circuit 110.

In response to a second state (e.g., a high level) of the signal AOCISO, a part of the first circuit is disabled. For example, as described herein, the level shifter circuit 130 is disabled in response to the high level of the signal AOCISO which turns OFF the PMOS transistor 136 and disconnects VDDM from the level shifter circuit 130. The NMOS transistor 138 is turned ON in response to the high level of the signal AOCISO, and sets the signal SD1 to the predetermined voltage of VSS. As a result, in one or more embodiments, the VDDM power domain is isolated from the VDD power domain at the disabled level shifter circuit 130, and signals in the VDD power domain do not affect signals in the VDDM power domain.

The level shifter circuit 140 is an example of a second circuit which is configured to control supply of the supply voltage VDDMHD to the memory circuit 110 in accordance with the signal AOCISO, signal SD and signal SLP. As described herein, in response to the first state (e.g., the low level) of the signal AOCISO, the level shifter circuit 140 is enabled and is configured to control supply of the supply voltage VDDMHD to the memory circuit 110 in accordance with the signal SDSLP. The signal SDSLP corresponds to a combination of the signal SD and signal SLP, is level-shifted by the enabled level shifter circuit 140 and supplied as the signal CS2 to turn ON or OFF the PMOS transistor 164. For example, in response to both the signal SD and the signal SLP having a first state (e.g., a low level), the signal SDSLP has a corresponding high level, the signal SDSLP1 has a corresponding high level, and the signal CS2 has a corresponding low level which turns ON the PMOS transistor 164 to output the supply voltage VDDMHD to the memory circuit 110. In response to any of the signal SD and the signal SLP having a second state (e.g., a high level), the signal SDSLP has a corresponding low level, the signal SDSLP1 has a corresponding low level, and the signal CS2 has a corresponding high level which turns OFF the PMOS transistor 164 to stop outputting the supply voltage VDDMHD to the memory circuit 110.

In response to the second state (e.g., the high level) of the signal AOCISO, the level shifter circuit 140 is disabled due to the high level of the signal AOCISO which turns OFF the PMOS transistor 146 and disconnects VDDM from the level shifter circuit 140. The NMOS transistor 148 is turned ON in response to the high level of the signal AOCISO, and sets the signal SDSLP1 to the predetermined voltage of VSS. As a result, in one or more embodiments, the VDDM power domain is isolated from the VDD power domain at the disabled level shifter circuit 140, and signals in the VDD power domain do not affect signals in the VDDM power domain.

The logic circuit 142 is an example of a third circuit which is configured to control supply of the supply voltage VDDHD to the memory circuit 110 in accordance with the signal SD and signal SLP. For example, in response to both the signal SD and the signal SLP having the first state (e.g., the low level), the signal SDSLP has the corresponding high level, and the signal CS3 has a corresponding low level which turns ON the PMOS transistor 166 to output the supply voltage VDDHD to the memory circuit 110. In response to any of the signal SD and the signal SLP having the second state (e.g., the high level), the signal SDSLP has the corresponding low level, and the signal CS3 has a corresponding high level which turns OFF the PMOS transistor 166 to stop outputting the supply voltage VDDHD to the memory circuit 110.

The signal SD and signal SLP correspond to a first power mode and a second power mode of the memory circuit 110. Both the first power mode and second power mode are reduced power modes in which power consumption of the memory circuit 110 is reduced compared to a normal operation mode. The second power mode corresponding to the signal SLP has higher power consumption than the first power mode corresponding to the signal SD. For example, the first power mode corresponding to the signal SD is a shut-down mode in which the entire memory circuit 110, including the memory array 102, is powered OFF, whereas the second power mode corresponding to the signal SLP is a sleep mode in which the peripheral circuitry 103 is powered OFF but the memory array 102 remains powered ON for data retention in the memory cells of the memory array 102. Other power modes are within the scopes of various embodiments. In some embodiments, one or more of the signal SD and signal SLP are generated to cause the memory circuit 110 to enter the corresponding reduced power modes, for reducing power consumption of the memory circuit 110, e.g., when the memory circuit 110, or an IC comprising or using the memory circuit 110 for data storage, is idling.

In some embodiments, disabling interface circuits, such as the level shifter circuit 130 and/or the level shifter circuit 140, in accordance with the signal AOCISO further reduces power consumption of the circuit 100. In at least one embodiment, not only interface circuits in the power management circuit 120, but also interface circuits in the memory circuit 110, are configured to be disabled in accordance with the signal AOCISO, to further reduce power consumption. In some embodiments, all interface circuits in the circuit 100 are configured to be disabled in accordance with the signal AOCISO.

In some embodiments, it is possible to further reduce power consumption by turning OFF VDD in a state referred to herein as VDD buck-off. For example, the circuit 100 comprises a header circuit 180 configured to controllably turn OFF VDD. In the example configuration in FIG. 1, the header circuit 180 comprises a PMOS transistor. Other header circuit configurations are within the scopes of various embodiments. In the example configuration in FIG. 1, the PMOS transistor 180 is outside the power management circuit 120 and memory circuit 110. In at least one embodiment, the PMOS transistor 180 is included in the power management circuit 120 or memory circuit 110.

The PMOS transistor 180 has a first source/drain coupled to a power rail 181, a second source/drain coupled to a power rail 183, and a gate configured to receive a control signal VDD_off. The power rail 181 is configured to receive a power supply voltage True VDD (TVDD). The power rail 181 is sometimes referred to as "TVDD power rail." In some embodiments, TVDD is a positive voltage generated by an external voltage supply outside the circuit 100. In some embodiments, TVDD is generated by an internal voltage supply included in the circuit 100. When the PMOS transistor 180 is turned ON by a low level of the control signal VDD_off, TVDD on the TVDD power rail 181 is provided, through the turned ON PMOS transistor 180, as VDD on the power rail 183. The power rail 183 is sometimes referred to as "VDD power rail." In some embodiments, VDD on the power rail 183 is referred to as Virtual VDD. When the PMOS transistor 180 is turned OFF by a high level of the control signal VDD_off, the VDD power rail 183 is disconnected from the TVDD power rail 181, and VDD is turned OFF for circuits coupled to the VDD power rail 183. In some embodiments, the VDD power rail 183 is floating when the PMOS transistor 180 is turned OFF. In some embodiments, the control signal VDD_off is generated by an external circuit outside the circuit 100. In some embodiments, the control signal VDD_off is generated by a control circuit included in the circuit 100. In some embodiments, the VDD power rail 183 is configured to supply VDD to one or more of circuits of the VDD power domain as described herein, including, but not limited to, the inverters 132, 134, 144, logic circuit 142, header circuit 166, circuits in the peripheral circuit 106, or the like. During VDD buck-off when the PMOS transistor 180 is turned OFF, the circuits of the VDD power domain coupled to the VDD power rail 183 are powered down, further reducing power consumption of the circuit 100.

FIG. 2 is a table 200 including various power modes of the circuit 100, in accordance with some embodiments. The logic values and ON or OFF states of various supply voltages in the table 200 are examples. Other logic values and/or ON or OFF states are within the scopes of various embodiments.

A power mode corresponding to the first row of the table 200 is a normal operation mode 201. Specifically, in response to the signal AOCISO, signal SD, signal SLP, signal AOCLHENB all having a low level corresponding to logic "0," the power management circuit 120 is configured to output the supply voltage VDDHD, supply voltage VDDMHD, supply voltage VDDAI correspondingly to the peripheral circuit 106, peripheral circuit 104, memory array 102, to cause the memory circuit 110 to operate in a normal operation.

A power mode corresponding to the second row of the table 200 is a sleep mode 202. Compared to the normal operation mode 201, each of the signal SLP and signal AOCLHENB in the sleep mode 202 has a high level corresponding to logic "1." The high level of the signal SLP causes the signal SDSLP to have the low level, resulting in the signals CS2, CS3 having the high level. As a result, the supply voltage VDDHD, supply voltage VDDMHD are turned OFF and the peripheral circuitry 103 is powered down. The high level of the signal AOCLHENB causes the latch circuit 150 to enter the latched state and store the state, i.e., low level, of the signal SD. As a result, the signal CS1 has the low level and supply of the supply voltage VDDAI to the memory array 102 is maintained for data retention.

A power mode corresponding to the third row of the table 200 is a shut-down mode 203. Compared to the normal operation mode 201, the signal SD in the shut-down mode 203 has the high level corresponding to logic "1." The high level of the signal SD causes the signal SDSLP to have the low level, resulting in the signals CS2, CS3 having the high level. As a result, the supply voltage VDDHD, supply voltage VDDMHD are turned OFF and the peripheral circuitry 103 is powered down. The high level of the signal SD further causes the signal SD1 and signal SD2 to have the low level, resulting in the signal CS1 having the high level. As a result, the supply voltage VDDAI is turned OFF and the memory array 102 is powered down. The levels of the signal SLP and signal AOCLHENB are irrelevant (or in a "don't care" state) in the shut-down mode 203, and are schematically shown as "-" in table 200.

A power mode corresponding to the fourth row of the table 200 is a further shut-down mode 204 in a power management state. The power management state corresponds to the signal AOCISO having the high level corresponding to logic "1." Similarly to the shut-down mode 203, the signal SD in the further shut-down mode 204 has the high level, causing the memory circuit 110 to be powered down. The high level of the signal AOCISO disables the level shifter circuits 130, 140, to further reduce power consumption compared to the shut-down mode 203. It is further possible to turn OFF VDD which is ON in the normal operation mode 201, sleep mode 202 and shut-down mode 203 where the signal AOCISO has the low level. The ability to turn OFF VDD, or to enter VDD buck-off, in the further shut-down mode 204 is schematically indicated as "ON/OFF" in table 200. In the example configuration in FIG. 2, the signal SLP has the low level. In at least one embodiment, the signal SLP is in the "don't care" state.

A power mode corresponding to the fifth row of the table 200 is a further sleep mode 205 in the power management state corresponding to the signal AOCISO having the high level. The signal SD, signal SLP, signal AOCLHENB are as in the sleep mode 202. As discussed with respect to the further shut-down mode 204, the further sleep mode 205 has further reduced power consumption compared to the sleep mode 202, due to the level shifter circuits 130, 140 being disabled and/or the ability to turn OFF VDD. In the example configuration in FIG. 2, VDDM is always ON in all power modes 201-205.

Figure 3:
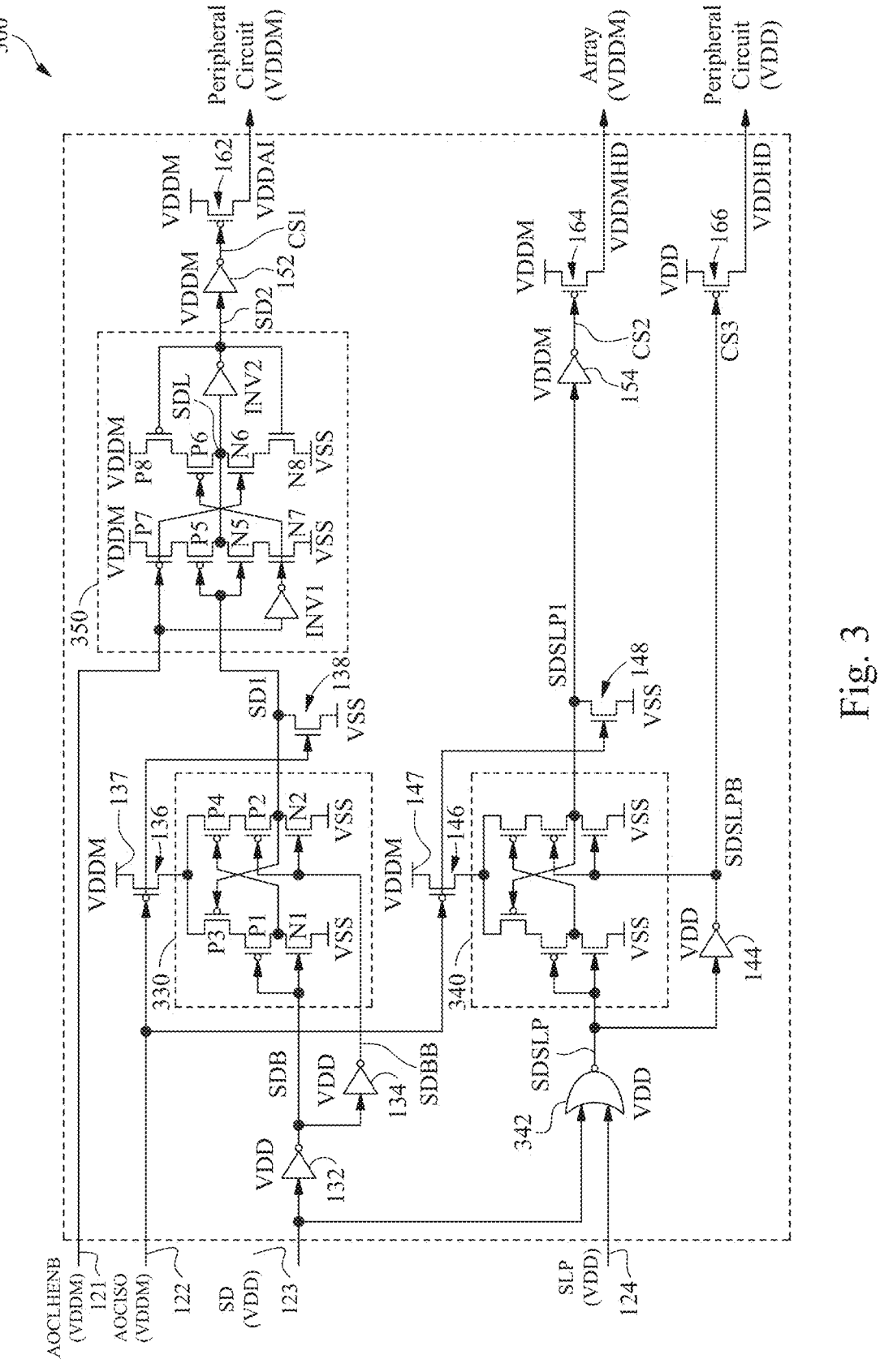
FIG. 3 is a schematic circuit diagram of a power management circuit, in accordance with some embodiments.

FIG. 3 is a schematic circuit diagram of a power management circuit 300, in accordance with some embodiments. In some embodiments, the power management circuit 300 corresponds to the power management circuit 120. For simplicity, corresponding components in FIGS. 1, 3 are designated by the same reference numerals.

The power management circuit 300 comprises level shifter circuits 330, 340, a NOR gate 342, and a latch circuit 350 corresponding to the level shifter circuits 130, 140, logic circuit 142, and latch circuit 150.

The level shifter circuit 330 comprises a first inverter configured by PMOS transistor P1 and NMOS transistor N1, a second inverter configured by PMOS transistor P2 and NMOS transistor N2, and a pair of PMOS transistors P3, P4. An input of the first inverter corresponds to the input 131 and is configured by gates of transistors P1, N1 which are electrically coupled together and to the input of the inverter 134. An output of the first inverter is configured by first source/drains of transistors P1, N1 which are electrically coupled together and to a gate of transistor P4. A second source/drain of transistor P1 is electrically coupled to a first source/drain of transistor P3. A second source/drain of transistor N1 is electrically coupled to VSS. An input of the second inverter also corresponds to the input 131 and is configured by gates of transistors P2, N2 which are electrically coupled together and to the output of the inverter 134. An output of the second inverter corresponds to the output 133 and is configured by first source/drains of transistors P2, N2 which are electrically coupled together and to a gate of transistor P3. A second source/drain of transistor P2 is electrically coupled to a first source/drain of transistor P4. A second source/drain of transistor N2 is electrically coupled to VSS. Second source/drains of transistors P3, P4 are electrically coupled to VDDM.

In operation, when the signal SDB has a high level, transistor P1 is turned OFF, transistor N1 is turned ON, and the output of the inverter 134 is at a low level. The output of the first inverter is electrically coupled by the turned ON transistor N1 to VSS and turns ON transistor P4. The low level at the output of the inverter 134 turns ON transistor P3 and turns OFF transistor N2. VDDM is applied through turned ON transistors P2, P4 to the gate of transistor P3 and turns OFF transistor P3. The signal SD1 has the high level. When the signal SDB has a low level, transistor P1 is turned ON, transistor N1 is turned OFF, and the output of the inverter 134 is at a high level. The high level at the output of the inverter 134 turns OFF transistor P3 and turns ON transistor N2. The gate of transistor P3 is electrically coupled by the turned ON transistor N2 to VSS, transistor P3 is turned ON, and the signal SD1 has the low level. VDDM is applied through turned ON transistors P1, P3 to the gate of transistor P4 and turns OFF transistor P4.

The level shifter circuit 340 has a configuration similar to the level shifter circuit 330, and a detailed description of the level shifter circuit 340 is omitted. The described level shifter circuit configuration is an example. Other level shifter circuit configurations are within the scopes of various embodiments. For example, a level shifter circuit in one or more embodiments has a configuration of an inverter, as described with respect to FIG. 5D.

The latch circuit 350 comprises PMOS transistors P5-P8, NMOS transistors N5-N8, and inverters INV1, INV2. Transistors P5, N5 are coupled into a third inverter having an input corresponding to a data input of the latch circuit 350, and is configured by gates of transistors P5, N5 which are electrically coupled together and to the output of the level shifter circuit 330 to receive the signal SD1. An output of the third inverter is configured by first source/drains of transistors P5, N5 which are electrically coupled together, to first source/drains of transistors P6, N6, and to an input of inverter INV2. A second source/drain of transistor P5 is electrically coupled to a first source/drain of transistor P7. A gate of transistor P7 corresponds to a control input of the latch circuit 350, and is coupled to the input 121 to receive the signal AOCLHENB, to an input of inverter INV1, and to a gate of transistor N6. A second source/drain of transistor P7 is coupled to VDDM. A second source/drain of transistor N5 is electrically coupled to a first source/drain of transistor N7. A gate of transistor N7 is coupled to an output of inverter INV1, and to a gate of transistor P6. A second source/drain of transistor N7 is coupled to VSS. A second source/drain of transistor P6 is electrically coupled to a first source/drain of transistor P8. A gate of transistor P8 corresponds to an output of the latch circuit 350, and is coupled to an output of inverter INV2, and to a gate of transistor N8. A second source/drain of transistor P8 is coupled to VDDM. A second source/drain of transistor N6 is electrically coupled to a first source/drain of transistor N8. A second source/drain of transistor N8 is coupled to VSS.

In operation, when the signal AOCLHENB has a low level, transistors P7, N7 are turned ON, and transistors P6, N6 are turned OFF. VDDM and VSS are applied through the turned ON transistors P7, N7 to the third inverter configured by transistors P5, N5. A signal SDL at the output of the third inverter is an inverted signal of the signal SD1. The signal SDL is further inverted by inverter INV2 and output from the latch circuit 350 as the signal SD2. In other words, the latch circuit 350 is in the "transparent" state, and passes the signal SD1 at the data input to the output as the signal SD2.

When the signal AOCLHENB has a high level, transistors P7, N7 are turned OFF, and transistors P6, N6 are turned ON. The turned OFF transistors P7, N7 isolate the signal SDL from the signal SD1. As a result, the signal SDL corresponds to a latched, previous state of the signal SD. For example, when the previous state of the signal SD is a low level (corresponding to the supply voltage VDDAI to be maintained), the signal SD1 has a corresponding high level, and the signal SDL has a corresponding low level. The low level of the signal SDL is latched when the signal AOCL- HENB switches to the high level. The latched low level of the signal SDL causes the signal SD2 to have a corresponding high level which turns OFF transistor P8 and turns ON transistor N8. VSS is applied through the turned ON transistors N8, N6 and maintains the latched low level of the signal SDL. As a result, the high level of the signal SD2 is also maintained, and output of the supply voltage VDDAI is maintained. When the signal AOCLHENB switches back to the low level, the latch circuit 350 returns to the "transparent" state, and the signal SDL and signal SD2 are updated based on the current state of the signal SD.

For another example, when the previous state of the signal SD is a high level (corresponding to stopping output of the supply voltage VDDAI), the signal SD1 has a corresponding low level, and the signal SDL has a corresponding high level. The high level of the signal SDL is latched when the signal AOCLHENB switches to the high level. The latched high level of the signal SDL causes the signal SD2 to have a corresponding low level which turns ON transistor P8 and turns OFF transistor N8. VDDM is applied through the turned ON transistors P8, P6 and maintains the latched high level of the signal SDL. As a result, the low level of the signal SD2 is also maintained, and output of the supply voltage VDDAI is stopped. When the signal AOCLHENB switches back to the low level, the latch circuit 350 returns to the "transparent" state, and the signal SDL and signal SD2 are updated based on the current state of the signal SD.

Further operations and/or power modes of the power management circuit 300 are similar to those described with respect to FIGS. 1-2. In at least one embodiment, one or more advantages described herein are achievable by the power management circuit 300 and/or a circuit, such as a memory circuit, comprising the power management circuit 300.

Figure 4A:
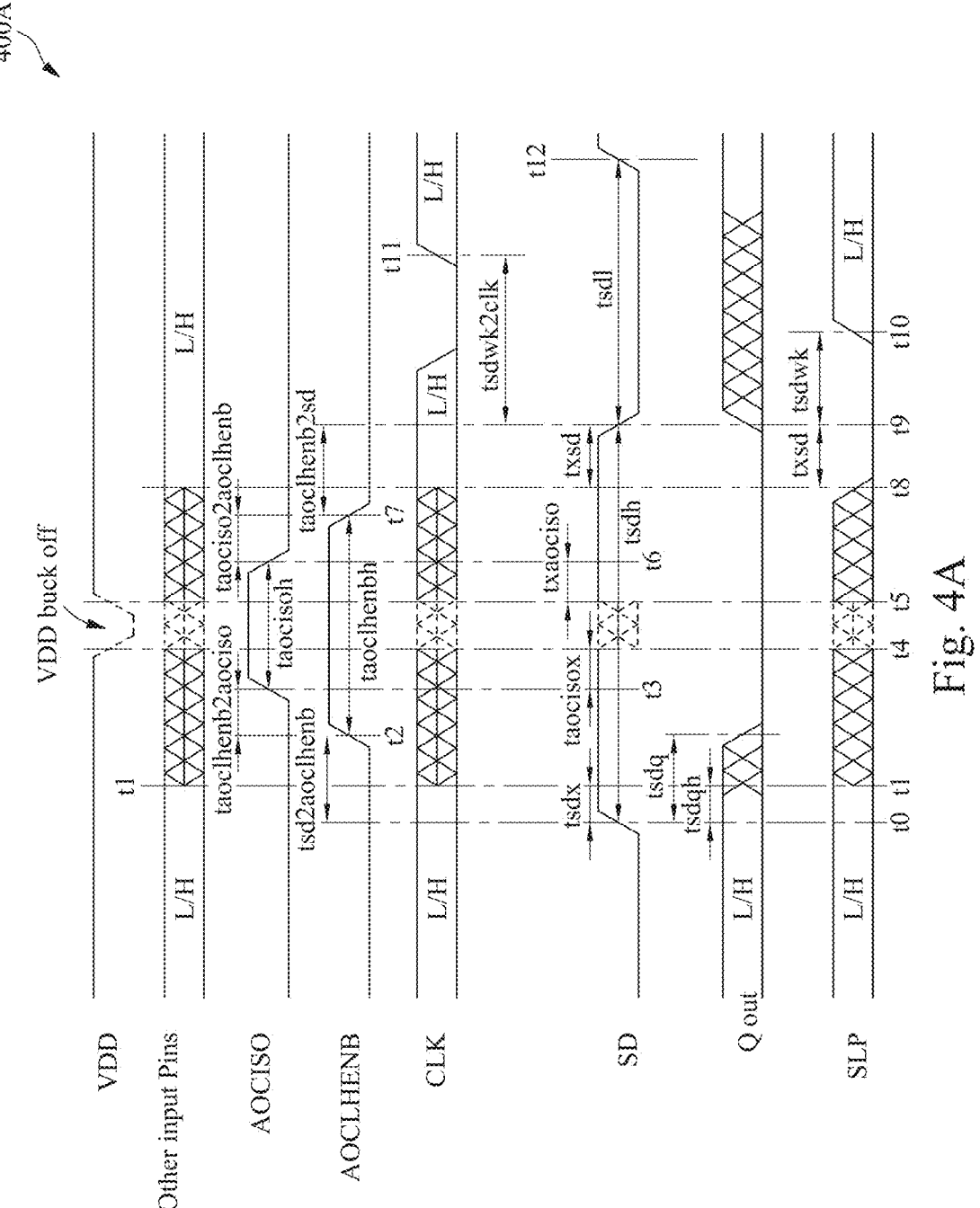
FIGS. 4A-4B are schematic timing diagrams of various operations of a circuit, in accordance with some embodiments.

FIG. 4A is a schematic timing diagram of an operation 400A of a circuit, in accordance with some embodiments. In some embodiments, the operation 400A described herein is performed in the circuit 100 to cause the memory circuit 110 to enter and wake up from a shut-down mode. In at least one embodiment, the operation 400A is performed using the power management circuit 300 in a similar manner. Corresponding signals in FIGS. 1-3 and 4A are designated by the same reference numerals. For example, a clock signal CLK and output data Qout in FIG. 4 correspond to clock signal CLK and output data Qout in FIG. 1. Further, the other input pins in FIG. 4 correspond to one or more inputs, such as WEB, CEB, Addr, Data, or the like, input/output through the peripheral circuitry 103.

In the operation 400A, prior to timing t0, VDD is ON, and each of the signal AOCISO, signal AOCLHENB, and signal SD has a low level. Each of the other input pins, clock signal CLK, output data Qout, and signal SLP has a low level or a high level, or switches between a low level and a high level, as schematically indicated by labels "L/H." In some embodiments, the signal SLP has a low level corresponding to the normal operation mode 201. In at least one embodiment, the signal SLP has a high level corresponding to the sleep mode 202.

At timing t0, the signal SD switches from the low level to a high level, causing the circuit to enter the shut-down mode from the normal operation mode 201 or from the sleep mode 202.

At timing t1, after a minimum time delay tsdx from timing t0, output of the supply voltage VDDHD and/or the supply voltage VDDMHD to the memory circuit 110 is stopped in response to the high level of the signal SD. As the peripheral circuitry 103 is partially or wholly powered down, signal levels of the other input pins, clock signal CLK are in a "don't care" state, as schematically indicated by the "X" symbols in FIG. 4A. For example, signals in the "don't care" state may have the low level or the high level, or may be floating. Because the signal SD has the high level, the signal level of the signal SLP is in the "don't care" state. The signal level of output data Qout becomes the "don't care" state after a minimum time delay tsdqh from timing t0. The output data Qout stops switching after a minimum time delay tsdq from timing t0. In at least one embodiment, because the output data Qout stops switching, power consumption is reduced. In some embodiments, output data Qout is caused to stop switching by setting an output pin of the peripheral circuitry 103 [and] corresponding to output data Qout to a predetermined voltage, such as VSS. In some embodiments, the output pin is set to the predetermined voltage by a switch, in a manner similar to that described with respect to the switches 138, 148.

At timing t2, after a minimum time delay tsd2aoclhenb (i.e., time from SD to AOCLHENB) from timing t0, the signal AOCLHENB switches from the low level to the high level. The state of the signal SD when the signal AOCLHENB switches from the low level to the high level is latched in the latch circuit 150. In the example configuration in FIG. 4A, the latched state of the signal SD is the high level which stops output of the supply voltage VDDAI to the memory array 102, as described herein.

At timing t3, after a minimum time delay taoclhenb2aociso (i.e., time from AOCLHENB to AOCISO) from timing t2, the signal AOCISO switches from the low level to the high level. The high level of the signal AOCISO disables the level shifter circuits 130, 140 in the power management circuit 120. In some embodiments, all interface circuits in the circuit 100 are disabled in response to the high level of the signal AOCISO. As can be seen in FIG. 4A, because timing t3 arrives after timing t2, the state of the signal SD is latched in the latch circuit 150 by the signal AOCLHENB switching to the high level before the level shifter circuits 130, 140 are disabled by the signal AOCISO switching to the high level. In some embodiments, tsd2aoclhenb corresponds to, or is determined based on, a setup time of the latch circuit 150 and/or taoclhenb2aociso corresponds to, or is determined based on, a hold time of the latch circuit 150. The setup time is a predetermined minimum amount of time required for the signal at the data input to be stable before an active clock edge, e.g., the rising edge of the signal AOCLHENB switching from the low level to the high level. The hold time is a predetermined minimum amount of time required for the signal at the data input to be stable after an active clock edge. After the signal AOCISO reaches the high level, the further shut-down mode 204 is achieved. It is possible now to turn OFF VDD to further reduce power consumption.

At timing t4, after a minimum time delay taocisox from timing t3, VDD is turned OFF, e.g., in response to a high level of the signal VDD_off, as described with respect to FIG. 1. The circuit 100 enters the VDD buck-off state. During the VDD buck-off state, the signal level of the signal SD becomes the "don't care" state.

At timing t5, VDD is turned ON and the circuit 100 leaves the VDD buck-off state, e.g., in response to a low level of the signal VDD_off. In some embodiments, VDD is automatically turned ON or OFF by an external circuit outside the circuit 100, or by a control circuit of the circuit 100.

At timing t6, after a minimum time delay txaociso from timing t5, the signal AOCISO is switched from the high level to the low level, to start waking up from the shut-down mode. The level shifter circuits 130, 140 are enabled in response to the low level of the signal AOCISO.

At timing t7, after a minimum time delay taocisosaoclhenb (i.e., time from AOCISO to AOCLHENB) from timing t6, the signal AOCLHENB is switched from the high level to the low level. In response to the low level of the signal AOCLHENB, the latch circuit 150 switches from the latched state to the "transparent" state. A minimum duration taoclhenbh of the high level of the signal AOCLHENB between timing t2 and timing t7 is longer than a minimum duration taocisoh of the high level of the signal AOCISO between timing t3 and timing t6.

At timing t8, the signal SLP is set to the low level, to be ready for the normal operation. The signal levels of the other input pins and clock signal CLK exit the "don't care" state.

At timing t9, after a minimum time delay taoclhenb2sd (i.e., time from AOCLHENB to SD) from timing t7 and/or a minimum time delay txsd from timing t8, the signal SD is switched from the high level to the low level. In response to the low level of the signal SD, the supply voltage VDDAI, supply voltage VDDMHD, supply voltage VDDHD are output to the memory circuit 110 to enter the normal operation. Output data Qout start switching again.

At timing t10, after a minimum time delay tsdwk from timing t9, the circuit 100 is permitted to enter a sleep mode, if needed.

At timing t11, after a minimum time delay tsdwk2clk from timing t9, the clock signal CLK resumes switching after being set to the low level during tsdwk2clk.

At timing t12, after a minimum time delay tsdl from timing t9, the circuit 100 is permitted to enter a shut-down mode, if needed.

Figure 4B:
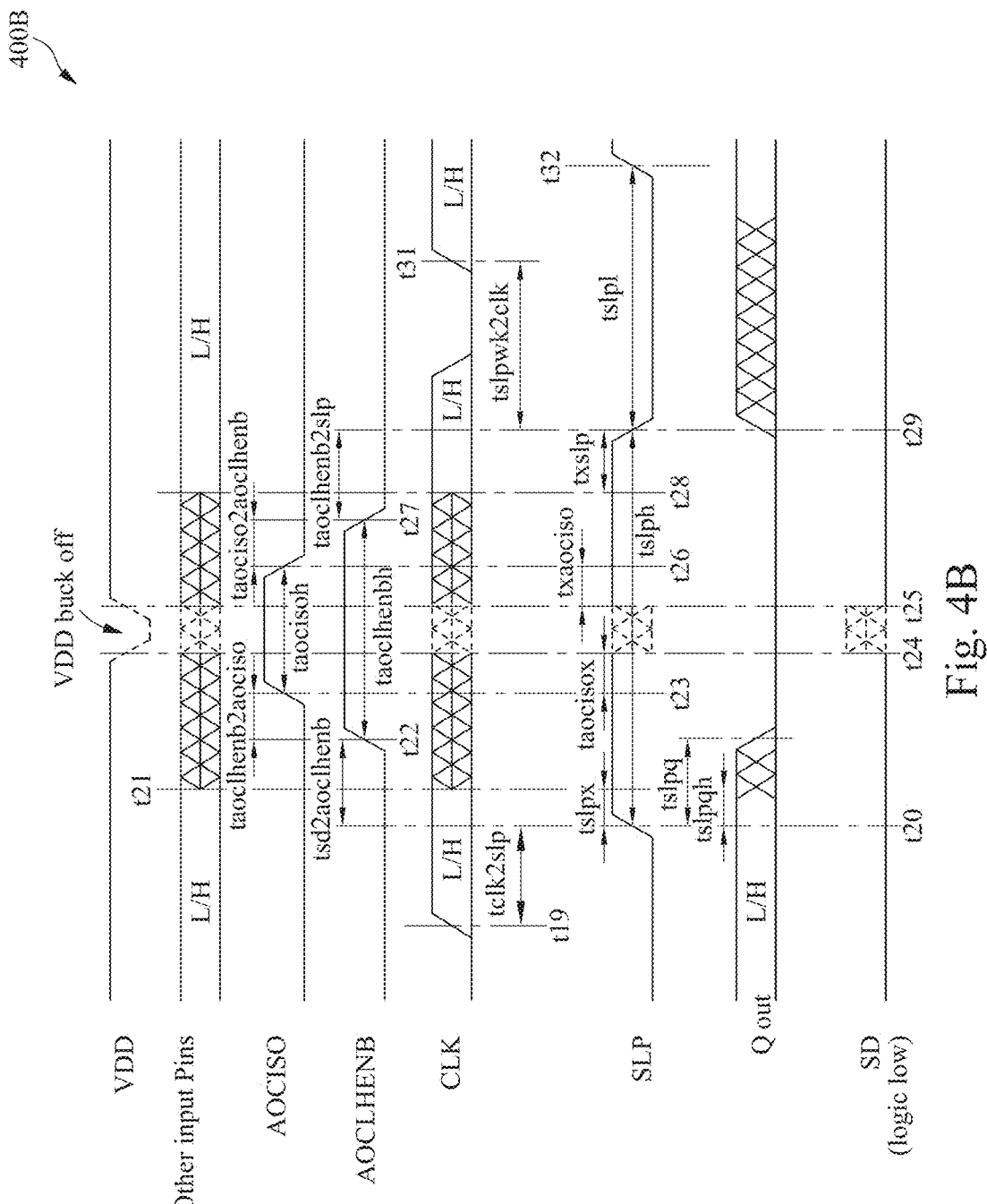

FIG. 4B is a schematic timing diagram of an operation 400B of a circuit, in accordance with some embodiments. In some embodiments, the operation 400B described herein is performed in the circuit 100 to cause the memory circuit 110 to enter and wake up from a sleep mode. In at least one embodiment, the operation 400B is performed using the power management circuit 300 in a similar manner. Corresponding signals in FIGS. 1-3, 4A and 4B are designated by the same reference numerals.

In the operation 400B, a timing t19 corresponds to when the clock signal CLK resumes switching after waking up from a previous shut-down or sleep mode. For example, timing t19 corresponds to timing t11 in the operation 400A.

Between timing t19 and timing t20, VDD is ON, and each of the signal AOCISO, signal AOCLHENB, signal SD and signal SLP has a low level, corresponding to the normal operation mode 201. Each of the other input pins, clock signal CLK, output data Qout has a low level or a high level, or switches between a low level and a high level.

At timing t20, the signal SLP switches from the low level to a high level, causing the circuit to enter a sleep mode from the normal operation mode 201.

At timing t21, after a minimum time delay tslpx from timing t20, output of the supply voltage VDDHD and/or the supply voltage VDDMHD to the memory circuit 110 is stopped in response to the high level of the signal SLP. As the peripheral circuitry 103 is partially or wholly powered down, signal levels of the other input pins, clock signal CLK are in the "don't care" state. The signal level of output data Qout becomes the "don't care" state after a minimum time delay tslpqh from timing t20. The output data Qout stops switching after a minimum time delay tslpq from timing t02. In at least one embodiment, because the output data Qout stops switching, power consumption is reduced. In some embodiments, output data Qout is caused to stop switching by setting an output pin of the peripheral circuitry 103 corresponding to output data Qout to a predetermined voltage, such as VSS.

At timing t22, after a minimum time delay tslp2aoclhenb (i.e., time from SLP to AOCLHENB) from timing t20, the signal AOCLHENB switches from the low level to the high level. The state of the signal SD (i.e., a low level) when the signal AOCLHENB switches from the low level to the high level is latched in the latch circuit 150. The latched state of the signal SD is the low level which ensures output of the supply voltage VDDAI to the memory array 102, as described herein.

At timing t23, after a minimum time delay taoclhenb2aociso from timing t22, the signal AOCISO switches from the low level to the high level. The high level of the signal AOCISO disables the level shifter circuits 130, 140 in the power management circuit 120. In some embodiments, all interface circuits in the circuit 100 are disabled in response to the high level of the signal AOCISO. As can be seen in FIG. 4B, because timing t23 arrives after timing t22, the state of the signal SD is latched in the latch circuit 150 by the signal AOCLHENB switching to the high level before the level shifter circuits 130, 140 are disabled by the signal AOCISO switching to the high level. In some embodiments, tslp2aoclhenb corresponds to, or is determined based on, a setup time of the latch circuit 150 and/or taoclhenb2aociso corresponds to, or is determined based on, a hold time of the latch circuit 150. After the signal AOCISO reaches the high level, the further sleep mode 205 is achieved. It is possible now to turn OFF VDD to further reduce power consumption.

At timing t24, after a minimum time delay taocisox from timing t23, VDD is turned OFF. The circuit 100 enters the VDD buck-off state. During the VDD buck-off state, the signal levels of the signal SD and signal SLP become the "don't care" state.

At timing t25, VDD is turned ON and the circuit 100 leaves the VDD buck-off state.

At timing t26, after a minimum time delay txaociso from timing t5, the signal AOCISO is switched from the high level to the low level, to start waking up from the shut-down mode. The level shifter circuits 130, 140 are enabled in response to the low level of the signal AOCISO.

At timing t27, after a minimum time delay taocisosaoclhenb from timing t26, the signal AOCLHENB is switched from the high level to the low level. In response to the low level of the signal AOCLHENB, the latch circuit 150 switches from the latched state to the "transparent" state. A minimum duration taoclhenbh of the high level of the signal AOCLHENB between timing t22 and timing t27 is longer than a minimum duration taocisoh of the high level of the signal AOCISO between timing t23 and timing t26.

At timing t28, the signal levels of the other input pins and clock signal CLK exit the "don't care" state.

At timing t29, after a minimum time delay taoclhenb2slp (i.e., time from AOCLHENB to SLP) from timing t27 and/or a minimum time delay txslp from timing t28, the signal SLP is switched from the high level to the low level. In response to the low level of the signal SLP, the supply voltage VDDMHD, supply voltage VDDHD are output to the memory circuit 110 to enter the normal operation. Output data Qout start switching again.

At timing t31, after a minimum time delay tslpwk2clk from timing t29, the clock signal CLK resumes switching after being set to the low level during tslpwk2clk.

At timing t32, after a minimum time delay tslpl from timing t29, the circuit 100 is permitted to enter a sleep mode, if needed. In some embodiments, one or more of the minimum time delays and/or durations described herein are configured, e.g., by the chip design, to ensure proper and/or reliable operation.

Figure 5A:
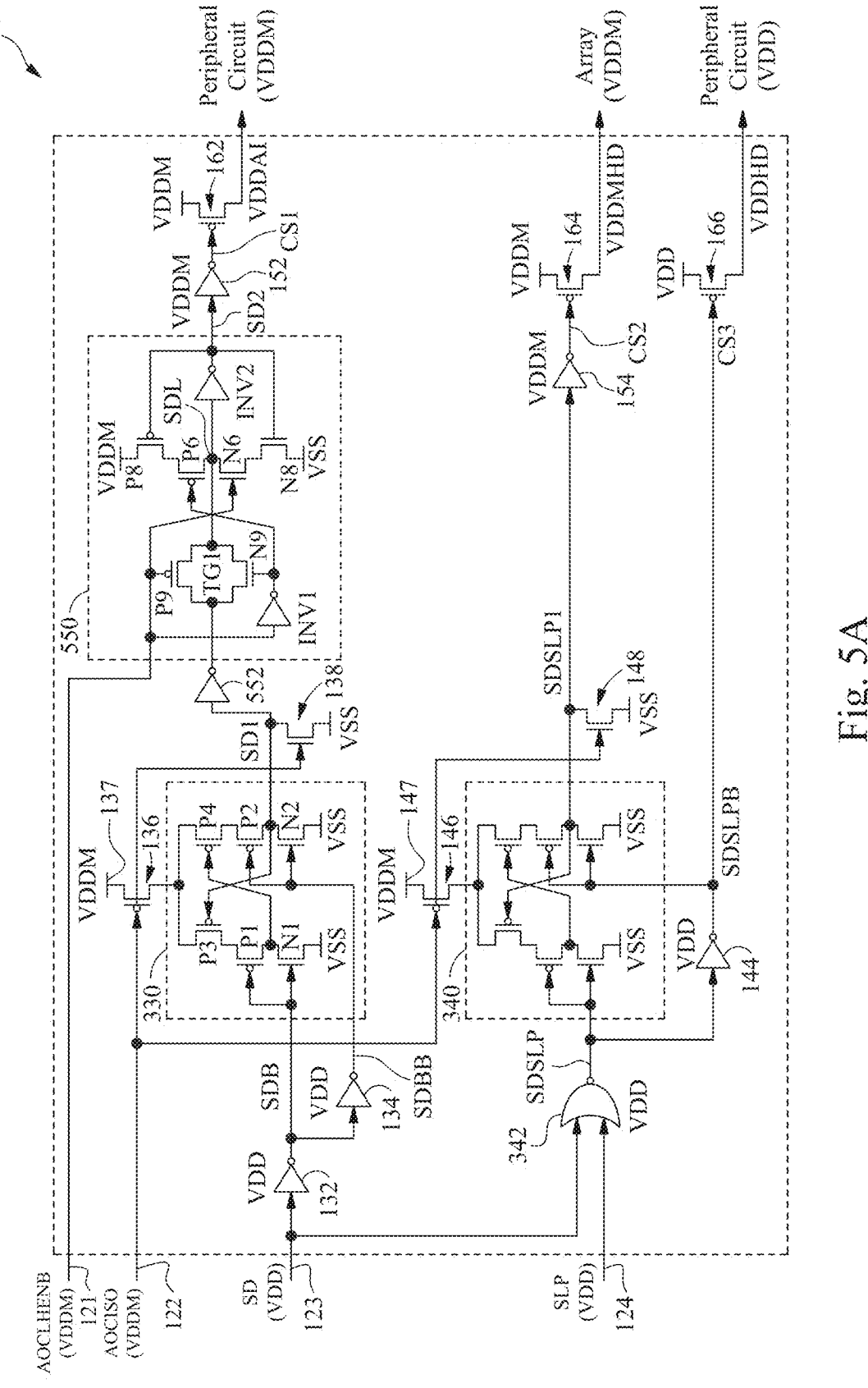
FIGS. 5A-5D are schematic circuit diagram of various circuits, in accordance with some embodiments.

FIG. 5A is a schematic circuit diagram of a power management circuit 500A, in accordance with some embodiments. In some embodiments, the power management circuit 500A corresponds to one or more of the power management circuits 120, 300. For simplicity, corresponding components in FIGS. 1, 3, 5A are designated by the same reference numerals.

Compared to the power management circuit 300, the power management circuit 500A comprises a different latch circuit configuration. Specifically, the power management circuit 500A comprises a latch circuit 550 corresponding to the latch circuit 350. The latch circuit 550 differs from the latch circuit 350 in that the latch circuit 550 comprises a transmission gate TG1 instead of transistors P5, P7, N5, N7 of the latch circuit 350. The power management circuit 500A further comprises an inverter 552 having an input coupled to the output of the level shifter circuit 330, and an output coupled to a data input of the latch circuit 550.

In the latch circuit 550, the transmission gate TG1 comprises a PMOS transistor P9 and an NMOS transistor N9 coupled in parallel. A gate of transistor P9 corresponds to a control input of the latch circuit 550, and is coupled to the input 121 to receive the signal AOCLHENB, to the input of inverter INV1, and to the gate of transistor N6. A gate of transistor N9 is coupled to the output of inverter INV1, and to the gate of transistor P6. First source/drains of transistors P9, N9 are coupled together, and configure the data input of the latch circuit 550. Second source/drains of transistors P9, N9 are coupled together, and to the input of inverter INV2. In some embodiments, the power management circuit 500A is configured to operate in manners similar to those described with respect to one or more of the power management circuits 120, 300. In at least one embodiment, one or more advantages described herein are achievable by the power management circuit 500A and/or a circuit comprising the power management circuit 500A.

Figure 5B:
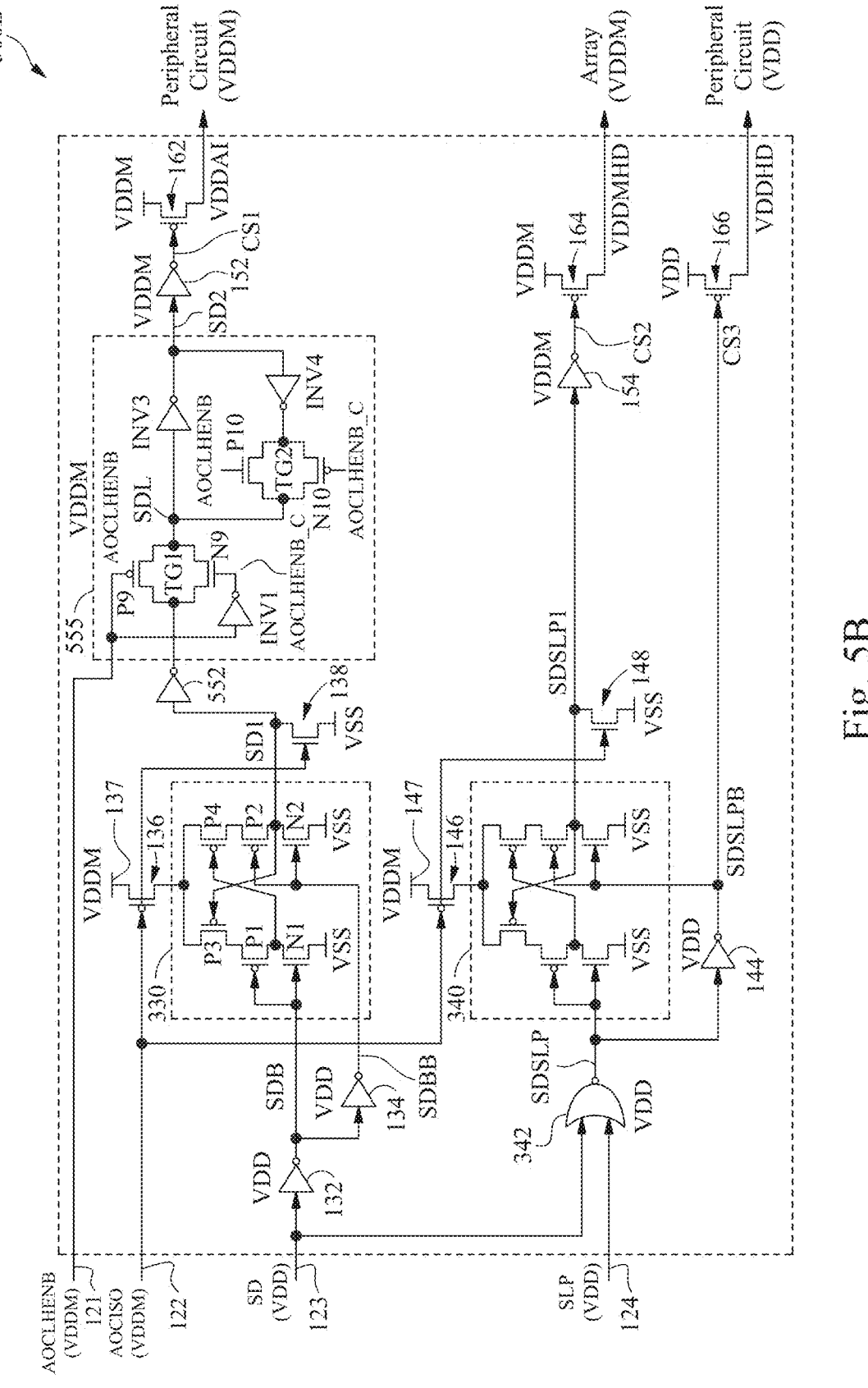

FIG. 5B is a schematic circuit diagram of a power management circuit 500B, in accordance with some embodiments. In some embodiments, the power management circuit 500B corresponds to one or more of the power management circuits 120, 300, 500A. For simplicity, corresponding components in FIGS. 1, 3, 5A, 5B are designated by the same reference numerals.

Compared to the power management circuit 500A, the power management circuit 500B comprises a different latch circuit configuration. Specifically, the power management circuit 500B comprises a latch circuit 555 corresponding to the latch circuit 550. The latch circuit 555 differs from the latch circuit 550 in that the latch circuit 555 comprises a transmission gate TG2 and inverters INV3, INV4 instead of transistors P6, P8, N6, N8 and inverter INV2 of the latch circuit 550.

In the latch circuit 555, the transmission gate TG2 comprises a PMOS transistor P10 and an NMOS transistor N10 coupled in parallel. A gate of transistor P10 is coupled to receive the signal AOCLHENB. For example, the gate of transistor P10 is coupled to the input 121. A gate of transistor N10 is coupled to receive a signal AOCLHENB_C which is an inverted signal of the signal AOCLHENB. For example, the gate of transistor N10 is coupled to the output of inverter INV1. First source/drains of transistors P10, N10 are coupled together, to the second source/drains of transistors P9, N9, and to an input of inverter INV3. Second source/drains of transistors P10, N10 are coupled together, and to an output of inverter INV4. An output of inverter INV3 and an input of inverter INV4 are coupled together and correspond to an output of the latch circuit 555. The signal SDL corresponding to a latched state of the signal SD is at the input of inverter INV3. In some embodiments, the power management circuit 500B is configured to operate in manners similar to those described with respect to one or more of the power management circuits 120, 300. In at least one embodiment, one or more advantages described herein are achievable by the power management circuit 500B and/or a circuit comprising the power management circuit 500B. The latch circuit configurations described with respect to FIGS. 3, 5A, 5B are examples. Other latch circuit configurations are within the scopes of various embodiments.

Figure 5C:
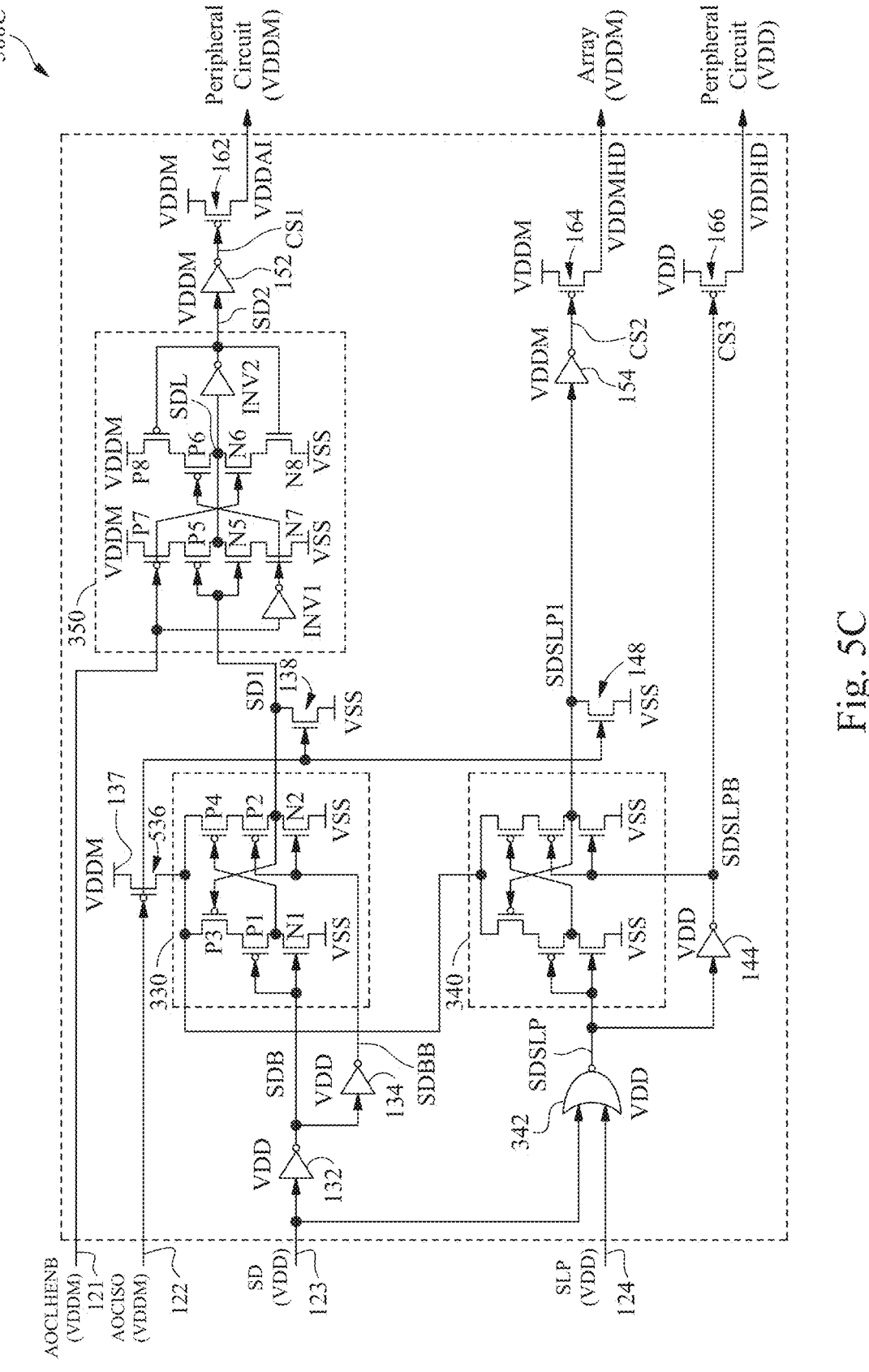

FIG. 5C is a schematic circuit diagram of a power management circuit 500C, in accordance with some embodiments. In some embodiments, the power management circuit 500C corresponds to one or more of the power management circuits 120, 300, 500A, 500B. For simplicity, corresponding components in FIGS. 1, 3, 5A-5C are designated by the same reference numerals.

Compared to the power management circuit 300, the power management circuit 500C comprises a header circuit or PMOS transistor 536 which is configured to operate as, and replaces, both PMOS transistors 136, 146 in the power management circuit 300.

In the power management circuit 500C, the PMOS transistor 536 has a first source/drain coupled to VDDM at the node 137, a second source/drain coupled to the level shifter circuits 130, 140 and a gate coupled to the input 122 to receive the signal AOCISO. In response to the signal AOCISO having the high level, the PMOS transistor 536 is turned OFF and disables both of the level shifter circuits 130, 140. In some embodiments, the power management circuit 500C is configured to operate in manners similar to those described with respect to one or more of the power management circuits 120, 300. In at least one embodiment, one or more advantages described herein are achievable by the power management circuit 500C and/or a circuit comprising the power management circuit 500C.

Figure 5D:
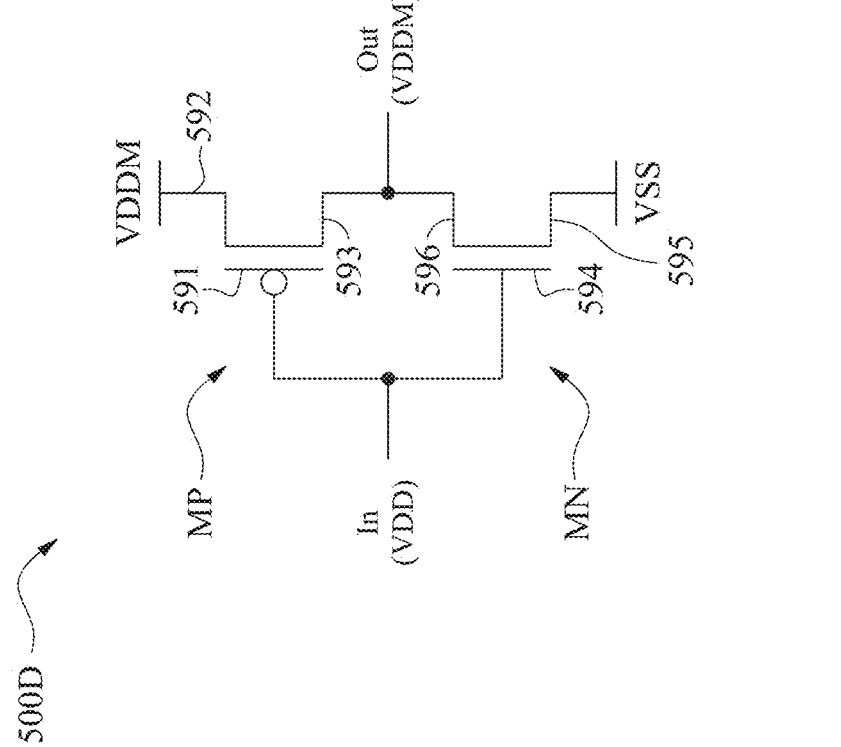

FIG. 5D is a schematic circuit diagram of a level shifter circuit 500D, in accordance with some embodiments. The level shifter circuit 500D has a configuration of an inverter. In some embodiments, the level shifter circuit 500D corresponds to one or more of the level shifter circuits 130, 140, 330, 340 and/or interface circuits described herein.

The level shifter circuit 500D comprises a PMOS transistor MP, and an NMOS transistor MN. The transistor MP comprises a gate 591, and source/drains 592, 593. The gate 591 is electrically coupled to an input In of the level shifter circuit 500D. The source/drain 592 is electrically coupled to a node of VDDM. The source/drain 593 is electrically coupled to an output Out of the level shifter circuit 500D. The transistor MN comprises a gate 594, and source/drains 595, 596. The gate 594 is electrically coupled to the gate 591 and the input In. The source/drain 595 is electrically coupled to a node of a reference voltage, e.g., VSS. The source/drain 596 of the transistor MN is electrically coupled to the source/drain 593 of the transistor MP and the output Out.

The level shifter circuit 500D is configured to receive an input signal at the input In, generate an inverted signal of the input signal, and output the inverted signal as an output signal at the output Out. The input signal at the input In is in the VDD power domain. The output signal at the output Out is in the VDDM power domain. As a result, the level shifter circuit 500D is configured to perform level-shifting between the VDD power domain and the VDDM power domain. In at least one embodiment, one or more advantages described herein are achievable by a power management circuit comprising the level shifter circuit 500D, and/or by a circuit comprising such power management circuit and/or interface circuits corresponding to the level shifter circuit 500D.

Figure 6:
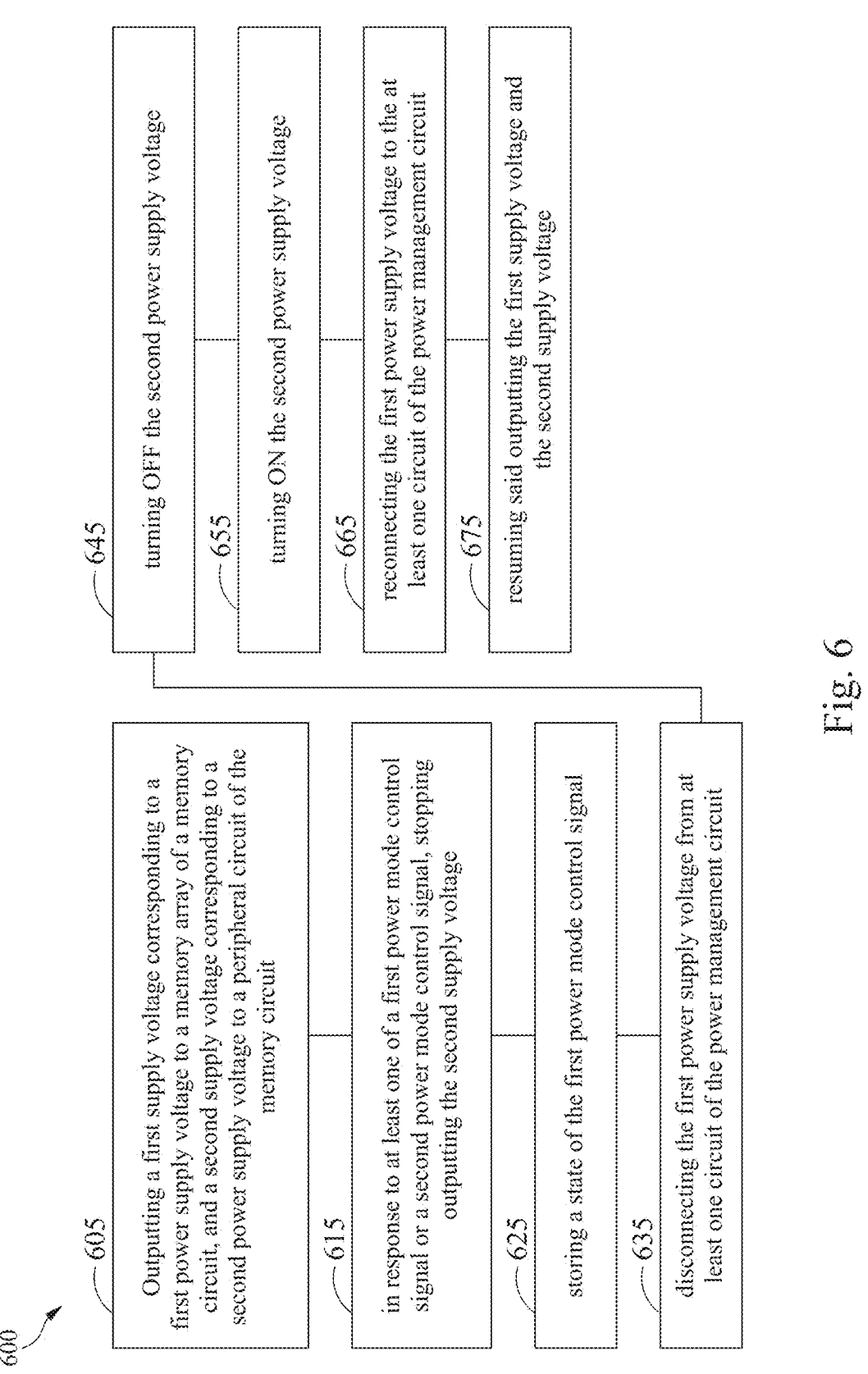
FIG. 6 is a flowchart of a method, in accordance with some embodiments.

FIG. 6 is a flowchart of a method 600, in accordance with some embodiments. In some embodiments, the method 600 is performed by one or more of the circuit 100, and a circuit comprising the power management circuit 300, 500A, 500B or 500C. In at least one embodiment, the method 600 is performed in accordance with one or more of the power modes in the table 200 and/or one or more of the operations 400A, 400B.

At operation 605, a power management circuit outputs a first supply voltage corresponding to a first power supply voltage to a memory array of a memory circuit, and outputs a second supply voltage corresponding to a second power supply voltage to a peripheral circuit of the memory circuit. For example, as described with respect to FIGS. 1, 4A, 4B, the power management circuit 120 outputs a first supply voltage VDDAI corresponding to a first power supply voltage VDDM to the memory array 102 of the memory circuit 110, and outputs a second supply voltage VDDHD corresponding to a second power supply voltage VDD to the peripheral circuit 106 of the memory circuit 110. In some embodiments, the power management circuit 120 further outputs a third supply voltage VDDMHD to the peripheral circuit 104 of the memory circuit 110.

At operation 615, in response to at least one of a first power mode control signal or a second power mode control signal, the output of the second supply voltage is stopped. For example, as described with respect to FIGS. 1, 4A, 4B, in response to any of a first power mode control signal SD or a second power mode control signal SLP having a predetermined level, e.g., a high level, a combined power mode control signal SDSLP having a corresponding level, e.g., a low level, is generated by the logic circuit 142. The power mode control signal SDSLP having the low level turns OFF the header circuit 166, and stops the output of the supply voltage VDDHD. In some embodiments, the power mode control signal SDSLP having the low level further turns OFF the header circuit 164 and stops the output of the supply voltage VDDMHD.

At operation 625, a state of the first power mode control signal is stored. For example, as described with respect to FIGS. 1, 4A, 4B, in response to a signal AOCLHENB having a predetermined level, e.g., a high level, the latch circuit 150 is caused to latch a state of the signal SD. In an example situation as described with respect to FIG. 4A, the latched state of the signal SD corresponds to a high level of the signal SD which stops the output of all supply voltages, including the supply voltage VDDAI, and causes the memory circuit 110 to enter a shut-down mode. In another example situation as described with respect to FIG. 4B, the latched state of the signal SD corresponds to a low level of the signal SD which maintains the output of the supply voltage VDDAI, and causes the memory circuit 110 to enter a sleep mode with data retention in the memory array 102.

At operation 635, the first power supply voltage is disconnected from at least one circuit of the power management circuit. For example, as described with respect to FIGS. 1, 4A, 4B, in response to a signal AOCISO having a predetermined level, e.g., a high level, the level shifter circuits 130, 140 of the power management circuit 120 are disconnected from VDDM by turning OFF the corresponding header circuits 136, 146. As a result, power consumption of the circuit 100 is reduced.

At operation 645, the second power supply voltage is turned OFF. For example, as described with respect to FIGS. 1, 4A, 4B, in response to a signal VDD_off having a predetermined level, e.g., a high level, the header circuit 180 is turned OFF and removes VDD from the VDD power rail 183. VDD is turned OFF for various circuits powered by the VDD power rail 183. In some embodiments, the VDD power domain is turned OFF. This state is referred to as VDD buck-off, and permits further reduction of power consumption.

At this stage, the circuit 100 enters a shut-down mode or a sleep mode (depending on the levels or states of the signal SD and/or signal SLP at operation 615) in a power management state with VDD buck-off, as described correspondingly with respect to the further shut-down mode 204 or the further sleep mode 205 in the table 200.

In some embodiments, the VDD buck-off state is not triggered, by not setting the signal VDD_off to the high level. In other words, operation 645 is omitted.

In some embodiments, the power management state is not entered, by not switching the signal AOCISO to the high level. In other words, operations 635, 645 are omitted. At this stage, the circuit 100 enters a shut-down mode or a sleep mode (depending on the levels or states of the signal SD and/or signal SLP at operation 615), as described correspondingly with respect to the shut-down mode 203 or the sleep mode 202 in the table 200.

To wake up from the shut-down mode or sleep mode that the circuit 100 has entered, one or more of operations 655-675 are performed.

At operation 655, the second power supply voltage, e.g., VDD, is turned back ON by controlling the signal VDD_off. Operation 655 is performed where VDD buck-off has been performed by operation 645. In at least one embodiment where operation 645 is omitted, operation 655 is also omitted.

At operation 665, the first power supply voltage, e.g., VDDM, is reconnected to the at least one circuit of the power management circuit. For example, the level shifter circuits 130, 140 are enabled again by turning ON the corresponding header circuits 136, 146 in response to the signal AOCISO switching to the low level. In at least one embodiment where operation 635 is omitted, operation 665 is also omitted.

At operation 675, the output of the first supply voltage and the second supply voltage from the power management circuit is resumed. For example, the signal AOCLHENB is switched to the low level to set the latch circuit 150 in the "transparent" state. The signal SD and the signal SLP are switched to the low level to enable output of the supply voltage VDDAI, supply voltage VDDMHD and supply voltage VDDHD to the memory circuit 110. At this stage, the circuit 100 is configured to operate in the normal operation mode 201 described with respect to FIG. 2.

In some embodiments, it is possible to switch from one reduced power mode to another reduced power mode. For example, in at least one embodiment, the circuit 100 is switched from the sleep mode 202 to the shut-down mode 203, by switching the signal SD to the high level. From the shut-down mode 203, it is possible to switch the circuit 100 to the further shut-down mode 204, by switching the signal AOCISO to the high level, with or without further VDD buck-off, as described herein. For another example, in at least one embodiment, the circuit 100 wakes up from a shut-down mode (e.g., 203 or 204) to a sleep mode (e.g., 202 or 205). Various switches among the described power modes, using one or more of the described signals, e.g., signal SD, signal SLP, signal AOCISO, signal AOCLHENB, signal VDD_off, in one or more of the described sequences, are within the scopes of various embodiments. In at least one embodiment, one or more advantages described herein are achievable by the method 600.

The various low levels and high levels described herein are example. It is within the scopes over various embodiments to modify one or more of the described circuits or signals to include a low level instead of a described high level, and vice versa. The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a circuit comprises a memory circuit, and a power management circuit comprising a first circuit. The first circuit is configured to, in response to a first state of the first power management control signal and a first state of the second power management control signal, control supply of a first supply voltage to the memory circuit in accordance with a first power mode control signal. The first circuit is further configured to, in response to a second state of the first power management control signal, store a state of the first power mode control signal, and control supply of the first supply voltage to the memory circuit in accordance with the stored state of the first power mode control signal. The power management circuit is configured to, in response to a second state of the second power management control signal, disable a part of the first circuit.

In some embodiments, a power management circuit comprises first-third inputs, first and second level shifter circuits, a latch circuit, and a first header circuit. The first input is configured to receive a first power management control signal. The second input is configured to receive a second power management control signal. The third input is configured to receive a first power mode control signal. The first level shifter circuit has an input coupled to the third input, and an output. The latch circuit has a control input coupled to the first input, a data input coupled to the output of the first level shifter circuit, and an output configured to control supply of a first supply voltage to external circuitry. The second level shifter circuit has an input coupled to the third input, and an output configured to control supply of a second supply voltage to the external circuitry. The first header circuit has a control input coupled to the second input. The first header circuit is coupled between a first node of a first power supply voltage, and at least one of the first level shifter circuit or the second level shifter circuit.

In some embodiments, a method comprises outputting, by a power management circuit, a first supply voltage to a memory array of a memory circuit, and a second supply voltage to a peripheral circuit of the memory circuit. The first supply voltage corresponds to a first power supply voltage. The second supply voltage corresponds to a second power supply voltage different from the first power supply voltage. In response to at least one of a first power mode control signal or a second power mode control signal, the outputting of the second supply voltage is stopped. A state of the first power mode control signal is stored. After storing the state of the first power mode control signal, the first power supply voltage is disconnected from at least one circuit of the power management circuit, and the second power supply voltage is turned OFF.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a memory circuit; and
a power management circuit comprising a first circuit, wherein
the first circuit is configured to,
in response to a first state of a first power management control signal and a first state of a second power management control signal,
control supply of a first supply voltage to the memory circuit in accordance with a first power mode control signal,
in response to a second state of the first power management control signal,
store a state of the first power mode control signal, and
control supply of the first supply voltage to the memory circuit in accordance with the stored state of the first power mode control signal, and
the power management circuit is configured to,
in response to a second state of the second power management control signal,
disable a part of the first circuit.

2. The circuit of claim 1, wherein
the first circuit is configured to store the state of the first power mode control signal in response to the second state of the first power management control signal before said part of the first circuit being disabled in response to the second state of the second power management control signal.

3. The circuit of claim 1, wherein
the first circuit comprises:
a first level shifter circuit configured to generate a first level-shifted signal corresponding to the first power mode control signal, to control supply of the first supply voltage to the memory circuit,
the power management circuit further comprises:
a second level shifter circuit configured to generate a second level-shifted signal corresponding to the first power mode control signal, to control supply of a second supply voltage to the memory circuit, and
the power management circuit is configured to, in response to the second state of the second power management control signal, disable the first level shifter circuit and the second level shifter circuit.

4. The circuit of claim 3, wherein
the first circuit further comprises a latch circuit configured to generate a latch output signal to control supply of the first supply voltage to the memory circuit, based on the first level-shifted signal, and the first power management control signal.

5. The circuit of claim 3, wherein
the power management circuit further comprises a logic circuit configured to generate a combined power mode control signal based on
the first power mode control signal, and
a second power mode control signal,
the power management circuit is configured to, based on the combined power mode control signal, control supply of a third supply voltage to the memory circuit, and
the second level shifter circuit is configured to, based on the combined power mode control signal, generate the second level-shifted signal to control supply of the second supply voltage to the memory circuit.

6. The circuit of claim 3, wherein
the power management circuit is further configured to, in response to the second state of the second power management control signal, set the first level-shifted signal and the second level-shifted signal to a predetermined voltage.

7. A circuit, comprising: a memory circuit and a power management circuit, wherein the power management circuit comprises:
a first input configured to receive a first power management control signal;
a second input configured to receive a second power management control signal;
a third input configured to receive a first power mode control signal;
a first level shifter circuit having:
an input coupled to the third input, and
an output;
a latch circuit having:
a control input coupled to the first input,
a data input coupled to the output of the first level shifter circuit, and
an output configured to control supply of a first supply voltage to external circuitry;
a second level shifter circuit having:
an input coupled to the third input, and
an output configured to control supply of a second supply voltage to the external circuitry; and
a first header circuit having a control input coupled to the second input, the first header circuit coupled between a first node of a first power supply voltage, and
at least one of the first level shifter circuit or the second level shifter circuit.

8. The circuit of claim 7, the power management circuit further comprising:
a switch having a control input coupled to the second input, the switch coupled between
a reference node of a reference voltage, and
the output of the first level shifter circuit or the second level shifter circuit.

9. The circuit of claim 7, the power management circuit further comprising:
a first switch having a control input coupled to the second input, the first switch coupled between
a reference node of a reference voltage, and
the output of the first level shifter circuit; and
a second switch having a control input coupled to the second input, the second switch coupled between
the reference node of the reference voltage, and
the output of the second level shifter circuit.

10. The circuit of claim 7, the power management circuit further comprising:
a fourth input configured to receive a second power mode control signal; and a logic circuit having:
inputs correspondingly coupled to the third input and the fourth input, and
an output configured to control supply of a third supply voltage to the external circuitry.

11. The circuit of claim 10, wherein
the output of the logic circuit is coupled to the input of the second level shifter circuit.

12. The circuit of claim 7, the power management circuit further comprising:
at least one circuit coupled to a second node of a second power supply voltage different from the first power supply voltage; and
a second header circuit coupled to the second node, and configured to controllably disconnect the second power supply voltage from the second node.

13. The circuit of claim 12, wherein
the at least one circuit comprises at least one of:
a first connection circuit coupled between the third input and the input of the first level shifter circuit,
a second connection circuit coupled between the third input and the input of the second level shifter circuit, or
an output header circuit configured to controllably supply a third supply voltage to the memory circuit, the third supply voltage corresponding to the second power supply voltage.

14. A circuit, comprising: a memory circuit and a power management circuit, wherein the power management circuit is configured to:
output a first supply voltage to a memory array of the memory circuit, the first supply voltage corresponding to a first power supply voltage and
output a second supply voltage to a peripheral circuit of the memory circuit, the second supply voltage corresponding to a second power supply voltage different from the first power supply voltage,
in response to at least one of a first power mode control signal or a second power mode control signal, stop outputting the second supply voltage,
store a state of the first power mode control signal, and
after storing the state of the first power mode control signal,
disconnect the first power supply voltage from at least one circuit of the power management circuit, and
turn OFF the second power supply voltage.

15. The circuit of claim 14, wherein the power management circuit is further configured to:
output a third supply voltage to the peripheral circuit, the third supply voltage corresponding to the first power supply voltage, and
in response to the at least one of the first power mode control signal or the second power mode control signal, stop outputting the third supply voltage.

16. The circuit of claim 15, wherein the power management circuit is further configured to:
disconnect the first power supply voltage from at least one interface circuit in the peripheral circuit, the at least one interface circuit interfacing between a first power domain of the first power supply voltage and a second power domain of the second power supply voltage.

17. The circuit of claim 14, wherein the power management circuit is further configured to:
in response to the stored state of the first power mode control signal corresponding to a first state, stop outputting the first supply voltage, and in response to the stored state of the first power mode control signal corresponding to a second state different from the first state, continue outputting the first supply voltage.

18. The circuit of claim 17, wherein the first state corresponds to a first power mode of the memory circuit, and the power management circuit is configured to stop outputting the second supply voltage in response to the first power mode control signal.

19. The circuit of claim 18, wherein the second state corresponds to a second power mode of the memory circuit, the second power mode having higher power consumption than the first power mode, and the power management circuit is configured to stop outputting the second supply voltage in response to the second power mode control signal.

20. The circuit of claim 14, wherein the power management circuit is further configured to:

turn ON the second power supply voltage, and after turning ON the second power supply voltage, reconnect the first power supply voltage to the at least one circuit of the power management circuit, and resume outputting the first supply voltage and the second supply voltage.

* * * * *